United States Patent [19]

Sugawara et al.

[11] Patent Number: 5,430,681

[45] Date of Patent: Jul. 4, 1995

[54] MEMORY CARTRIDGE AND ITS MEMORY CONTROL METHOD

[75] Inventors: Ken Sugawara, Ibaraki; Shigeru Sakairi, Tsukuba; Mikio Matoba, Ibaraki; Toshio Sasaki, Hachioji; Katsuhiro Shimohigashi, Musashimurayama; Katsutaka Kimura, Akishima, all of Japan

[73] Assignees: Hitachi Maxell, Ltd., Osaka; Hitachi, Ltd., Tokyo, both of Japan

[21] Appl. No.: 266,870

[22] Filed: Jul. 5, 1994

Related U.S. Application Data

[63] Continuation of Ser. No. 623,662, filed as PCT/JP90/00583, May 7, 1990, abandoned.

[30] Foreign Application Priority Data

| | | |
|---|---|---|
| May 8, 1989 [JP] | Japan | 1-113713 |
| May 8, 1989 [JP] | Japan | 1-113714 |
| Jun. 6, 1989 [JP] | Japan | 1-143779 |
| Jul. 13, 1989 [JP] | Japan | 1-180851 |
| Sep. 22, 1989 [JP] | Japan | 1-245234 |

[51] Int. Cl.⁶ ............................... G11C 11/40
[52] U.S. Cl. ................... 365/222; 365/227; 365/229; 365/233.5
[58] Field of Search ........ 365/229, 222, 233.5, 365/226, 227, 194

[56] References Cited

U.S. PATENT DOCUMENTS

| | | | |
|---|---|---|---|
| 3,599,180 | 8/1971 | Rubinstein et al. | 365/222 |
| 3,969,706 | 7/1976 | Proebsting et al. | 365/233 |
| 3,982,141 | 9/1976 | Copeland, III | 307/296.1 |
| 4,313,180 | 1/1982 | Mochizuki et al. | 365/222 |
| 4,316,248 | 2/1982 | Retter | 365/222 |
| 4,334,295 | 6/1982 | Nagami | 365/222 |
| 4,802,135 | 1/1989 | Shinoda et al. | 365/233 |
| 4,908,790 | 3/1990 | Little et al. | 365/229 |
| 4,921,381 | 5/1990 | Tokuume | 365/222 |
| 4,954,993 | 9/1990 | Yamaguchi et al. | 365/229 |
| 5,046,052 | 9/1991 | Miyaji et al. | 365/229 |
| 5,241,643 | 8/1993 | Durken et al. | 365/230.08 |
| 5,283,885 | 2/1994 | Hollerbauer | 365/222 |

FOREIGN PATENT DOCUMENTS

| | | |
|---|---|---|
| 0128427 | 12/1984 | European Pat. Off. |
| 54-96333 | 7/1979 | Japan |
| 56-105384 | 8/1981 | Japan |
| 56-153580 | 11/1981 | Japan |
| 59-87695 | 5/1984 | Japan |
| 61-271694 | 12/1986 | Japan |
| 62-154537 | 10/1987 | Japan |
| 63-75914 | 4/1988 | Japan |
| 63-155495 | 6/1988 | Japan |
| 63-281296 | 11/1988 | Japan |
| 64-84496 | 3/1989 | Japan |
| 1554013 | 10/1979 | United Kingdom |

OTHER PUBLICATIONS

"Decoupling Dynamic RAMS Up to 256K and Beyond" by Dr. Philip Ward, New Electronics, Mar. 5, 1985, pp. 56, 58, 59.

"MOSFET Switches Memory-Supply Current", by Steve Mowry, EDN-Electrical Design News, 33 (1988) Jan. 7, No. 1, p. 202.

"Battery Backup Keeps CMOS RAMS's Alive" by Sigurd L. Lillevik, EDN-Electrical Design News, vol. 23, No. 17 (1978.09) p. 150.

Nikkei Electronics, Aug. 10, 1987, No. 427, pp. 167–183.

Primary Examiner—Joseph A. Popek
Assistant Examiner—Vu Le

[57] ABSTRACT

A memory cartridge having a plurality of dynamic memory units includes an access conversion circuit which converts a static access signal into its inverted signal and an access control circuit which controllably switches between a signal for refreshing each dynamic unit and a signal for external access. The memory cartridge also includes a power switching circuit which switches power from an internal power supply to an external power supply when the memory cartridge is mounted to an external device.

15 Claims, 22 Drawing Sheets

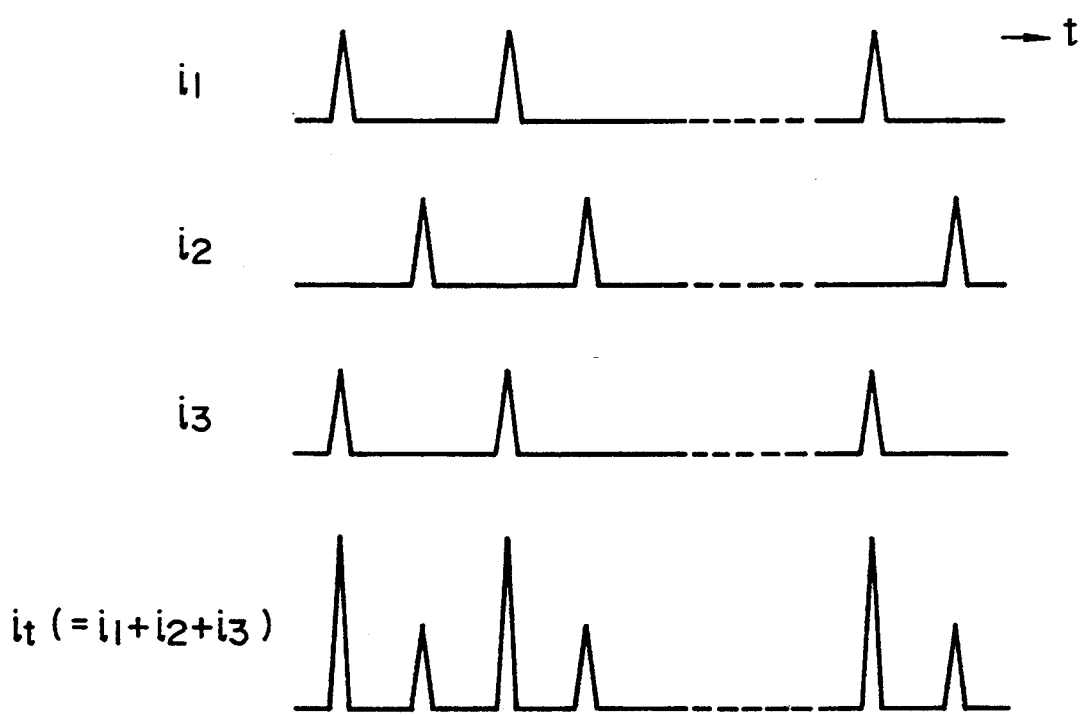

F I G. 5A
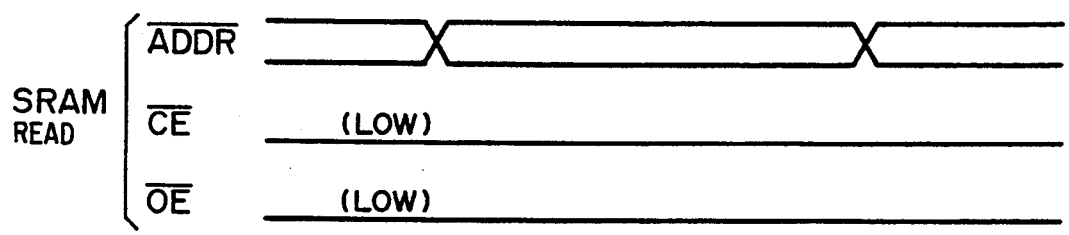
F I G. 5B
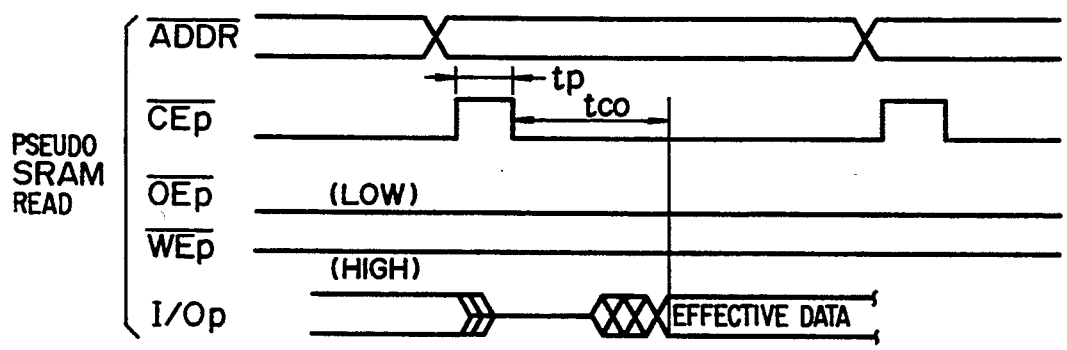

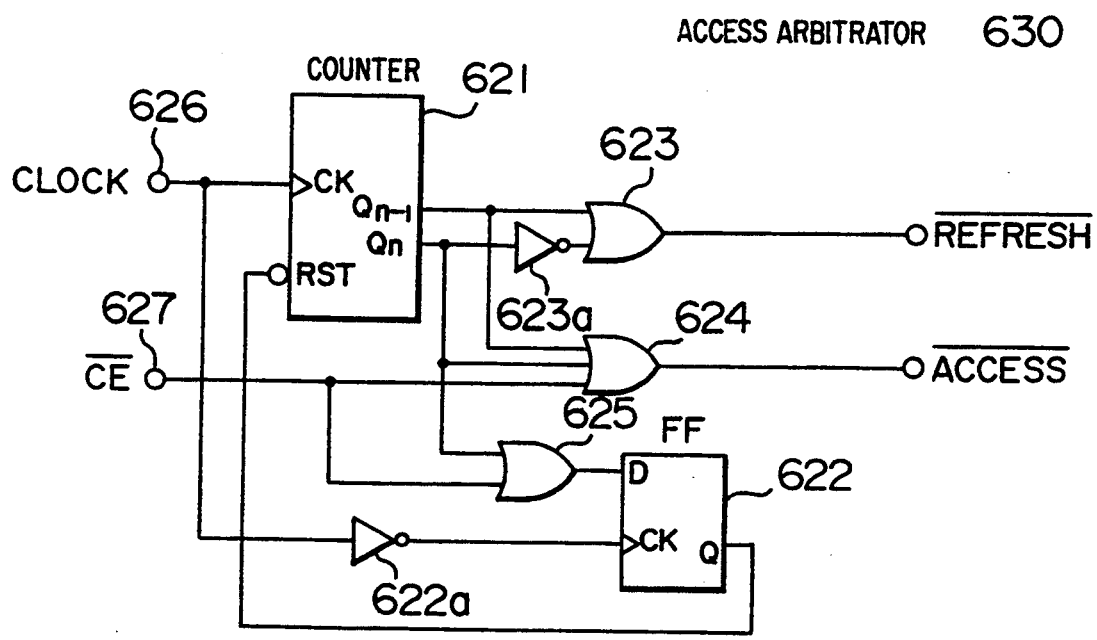

F I G. 9
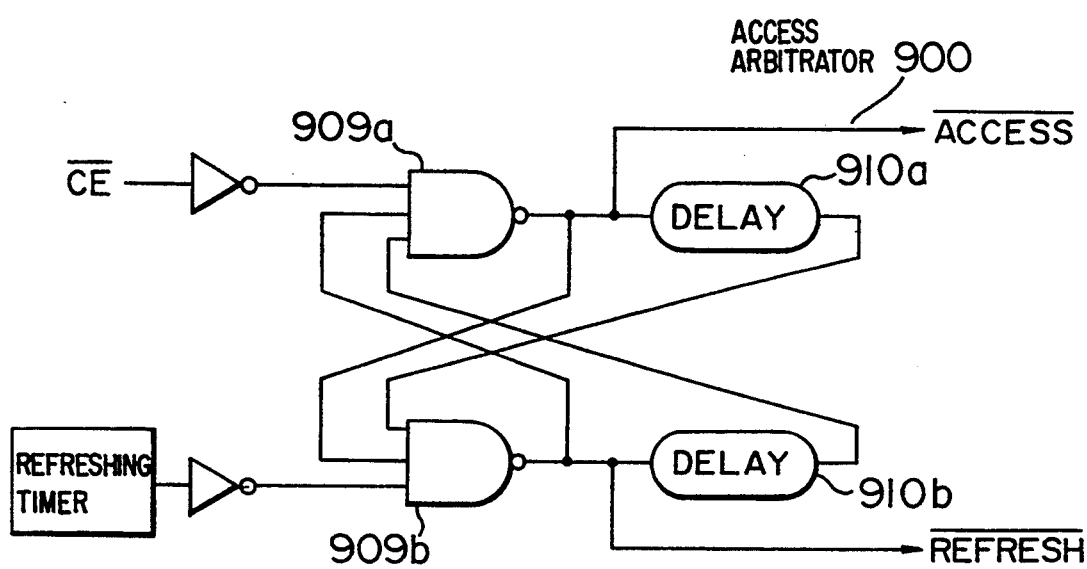

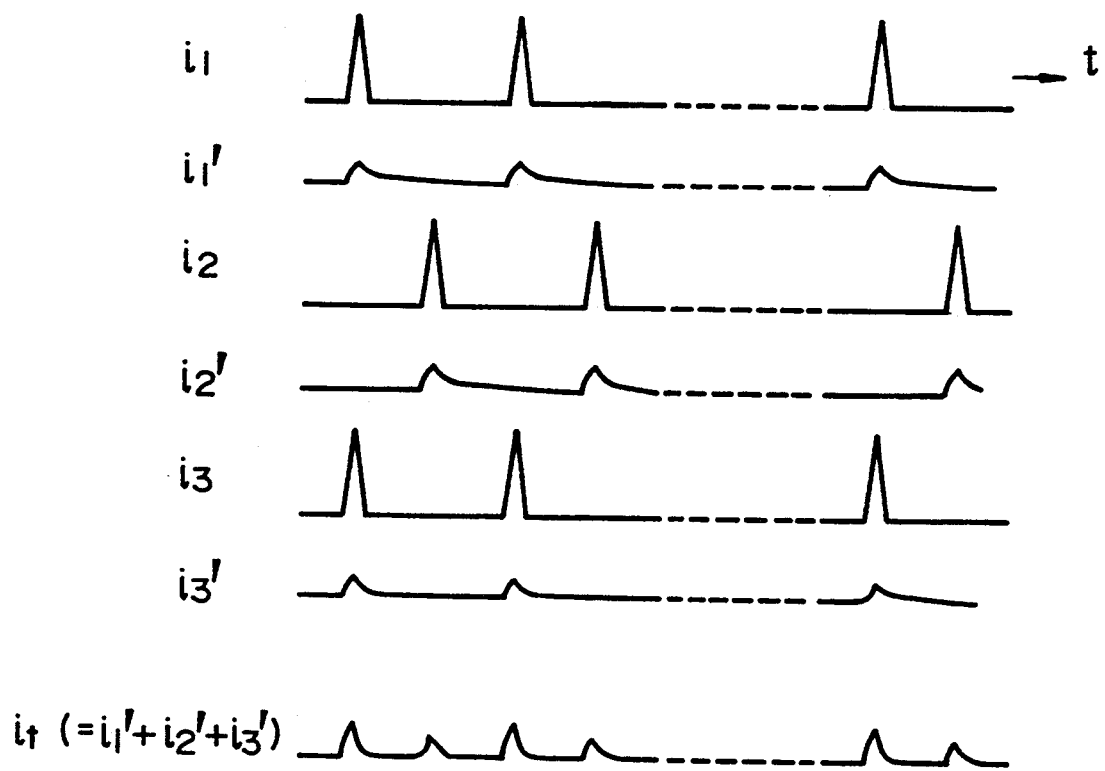
F I G. 10B

F I G. 12
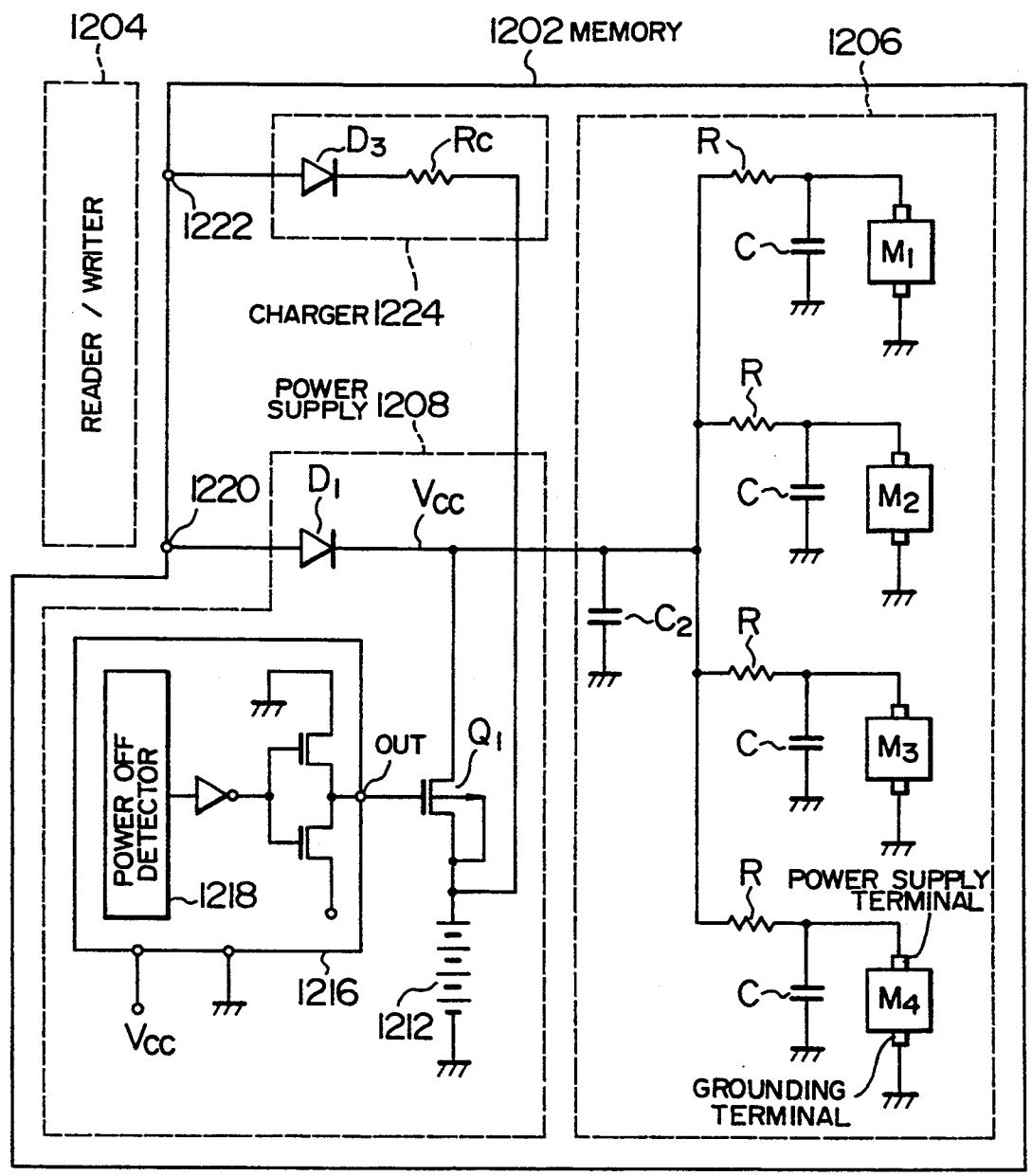

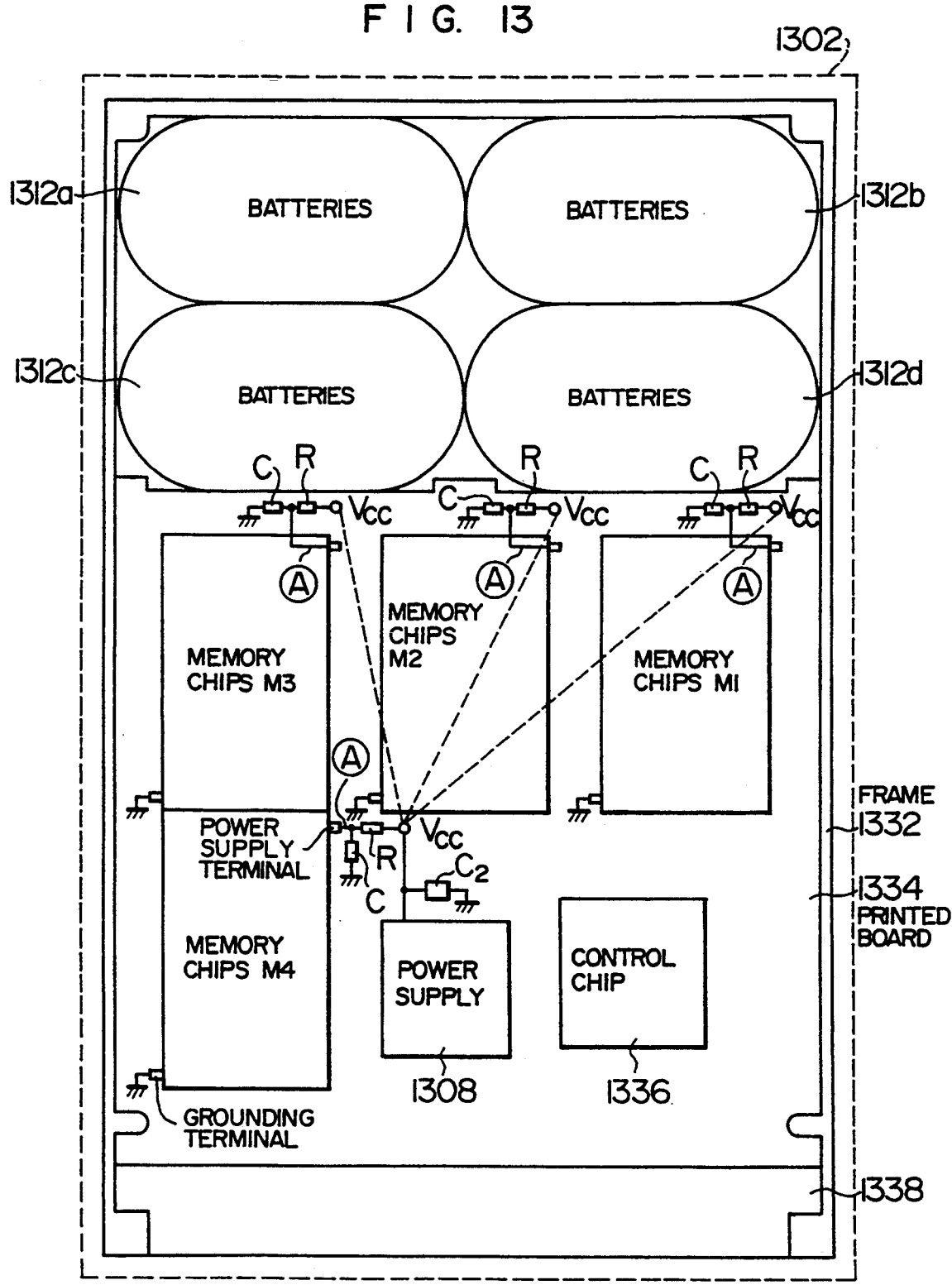

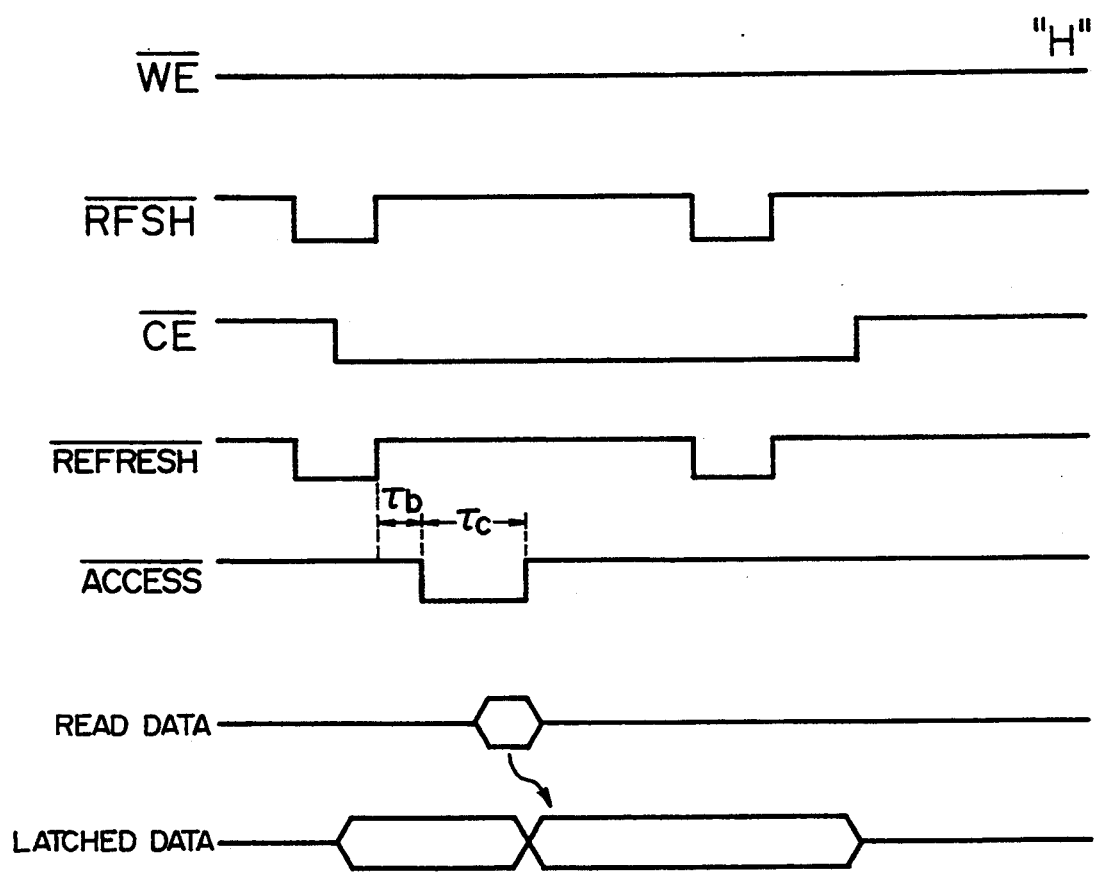
F I G. 20

MEMORY CARTRIDGE AND ITS MEMORY CONTROL METHOD

This application is a continuation of application Ser. No. 07/623,662 filed as PCT/JP90/00583, May 7, 1990, now abandoned.

BACKGROUND OF THE INVENTION

The present invention generally relates to memory cartridges and, more particularly, to a memory cartridge which has a dynamic random access memory DRAM incorporating a refresh circuit therein.

DESCRIPTION OF THE BACKGROUND ART

There have been widely used memory cartridges of a type in which an SRAM is backed up by means of battery. As great reduction in the consumption power of a DRAM has been recently realized, there has also appeared in the market memory cartridges of another type wherein the DRAM is backed up by means of a battery.

This is because the use of the DRAM can realize a memory capacity about 4 times larger than the use of the DRAM for the same size of memory. Accordingly, the use of the DRAM like the DRAM contributes greatly to increase in the memory capacity of the memory cartridge.

However, since the DRAM generally requires a refreshing time of several ten $\mu$ sec with a period of several msec, it is necessary to provide such a control circuit as to controllably adjust external access and refreshing operation. In addition, the memory cartridge of the SRAM type uses such a control signal as a chip enable signal having a format different from that used in the memory cartridge of the DRAM type and the SRAM type of memory cartridge is different in interface from the DRAM type of memory cartridge, which disadvantageously results in incompatibility between these SRAM and DRAM types.

A known example of a battery for backing up the operation of such a memory cartridge is taught in a magazine titled "NIKKEI ELECTRONICS", Aug. 10, 1987 (No. 427), pp. 167–183.

Conventional semiconductor memories capable of backing up information by means of battery include a flip-flop type static memory comprising 6 or 4 MOS transistors and two high resistances and a dynamic memory comprising a single MOS transistor and a single information storage capacitance (of several ten fF). The static memory, in particular, is suitable as a battery backup device because it requires a stationary (DC) consumption current as small as several ten nA or $\mu$A in a wait operation mode for the purpose of holding data. The dynamic memory, on the other hand, is suitably used in such a large-capacity memory system as a semiconductor file which can have memory capacity 4 times larger than the static memory and can be more inexpensively made in cost per bit than the static memory when the same level of processing technique is employed. When the dynamic memory is backed up by means of battery, however, this involves problems which follow. For this reason, the dynamic memory has not sufficiently been used as a portable semiconductor file memory.

Generally speaking, in the case of the dynamic memory, even when the memory shifts from its normal operation (active condition) mode wherein accessing is allowed for reading and writing operation to its wait operation (inactive condition) mode for the purpose of holding data, the memory must refresh (rewrite) data therein in a predetermined time. For example, in the case of a 1M bit memory, its refreshing period is set at usually 8 msec due to the limitation of the data holding time of the memory cells so that all the memory cells can be refreshed through 512 refreshing operations.

A first one of the problems in the above data holding operation, i.e., in the wait operation, is that the average consumption current of the dynamic memory necessary for the wait operation is as large as several hundred $\mu$A or mA. A second problem is that the peak level of a momentary AC current flowing in the refreshing-operation activation mode is as high as 100 mA or more.

As a measure against the former problem, it is most effective to prolong the refreshing period in the wait mode, as discussed in the aforementioned known literature.

The peak current as the latter problem is mainly due to the charging and discharging operation of the capacitances of bit lines connected to the memory cells. The total bit line capacitance for one refreshing operation amounts to several hundred pF and thus a momentarily large current flows through the memory. A memory system using the prior art dynamic memories causing such a peak current will be explained by referring to FIGS. 1A and 1B.

More specifically, FIG. 1A is an arrangement of a battery backup type memory system 102, and FIG. 1B shows waveforms of peak currents flowing through power supply lines for the respective memories and of a peak current flowing through a common power supply line corresponding to a sum of the respective memory peak currents.

In FIG. 1A, the memory system 102 is made in the form of an easily portable file, a reader/writer 104 performs reading and writing operation from and to the memory system 102, a main power source 110 is a power supply means for the memory circuit 102, and a switch (SW) 114 is used to turn on or off the main power source 110. The memory system 102 includes a power supply circuit 108 for the memory system. The power supply circuit 108 in turn has an auxiliary power supply 112 for data backup as a second power supply means, diodes $D_1$ and $D_2$ for preventing a reverse current caused by a voltage drop in either one of the main and auxiliary power supplies 110 and 112 in the backup operation. The memory system 102 also includes memory chips $M_1$ to $M_3$, and capacitances $C_1$ for removal of high frequency noise components in the power supply. In FIG. 1B, reference symbols $i_1$ to $i_3$ denote the waveforms of the peak currents for the respective memory chips with abscissa axis representing time t, and $i_t$ denotes a sum of the peak currents $i_1$ to $i_3$ ($=i_1+i_2+i_3$) flowing through a common power supply line $V_{cc}$. In the drawing, the illustrated peak currents $i_1$ and $i_3$ have respectively two peaks overlapped together. This results from the fact that the dynamic memory of the present embodiment performs its self refreshing operation and varies in its oscillation period. Reference symbols $r_1$ and $r_2$ are respectively internal resistances for the main and auxiliary power supplies 110 and 112. The auxiliary power supply 112 is usually a dry cell and its internal resistance $r_2$ is as high as several $\Omega$. The internal resistance $r_1$ of the main power supply 110 is smaller by one figure than the internal resistance $r_2$.

With such an arrangement, when the switch (SW) 114 is in its ON state, a current is supplied to the respective memory chips from the main power source 110 having the very low internal resistance $r_1$ so that, even when the peak current is large, the memory system 102 can normally execute its refreshing operation. When the SW 114 is in its OFF state, i.e., when the main power source 110 is in its cut-off state, on the other hand, a current is supplied from the auxiliary power supply 112, but since the auxiliary power source 112 has the internal resistance $r_2$ as high as several $\Omega$, the momentary discharging current ability is low. As a result, the power supply voltage $V_{cc}$ of the memory chips is remarkably reduced and the substrate potential is remarkably varied, which leads to the erroneous operation of the system.

As has been explained above, since the dynamic memory is large in its peak current, when such a small size battery as a button shaped battery having a large internal resistance is used, the momentary current supply ability becomes low. For this reason, even in the case of a small-capacity memory system, it becomes difficult to back up data for a long period of time or temporarily. Further, even when such a large-capacity cell as a lead battery is employed, it is difficult to realize the backup operation of such a large-capacity memory system that a multiplicity of dynamic memories are to be simultaneously refreshed, because the peak currents of the respective memory chips may be sufficiently considered to be overlapped together.

FIG. 2A shows an arrangement of a prior art dynamic memory system and FIG. 2B, a waveform of a peak current flowing through a power supply in its refreshing operation.

In more detail, an LSI chip 210 of FIG. 2A includes a memory array 212, an X-direction address buffer 214, a Y-direction address buffer 216, a data input/output (I/O) buffer 218, an X-direction decoder (XD) 220, a Y-direction decoder (YD) 222, and a data input/output signal line 224. The LSI chip 210 further includes a refreshing controller 226 having therein a self-refreshing timer, an address counter and elements associated with the refreshing operation. The memory array 212 includes dynamic memory cells MC, n word lines W for selection of the memory cells arranged in an X direction, and m bit lines B of the memory cells arranged in a Y direction. In FIG. 2A, reference symbol $AX_i$ denotes a group of address signals for determining X-direction positions of the memory cells within the LSI chip 210, $AY_i$ a group of address signals for determining Y-direction positions of the memory cells, $I/O_i$ input/output data signals, and $\overline{REF}$ a refreshing control signal. This $\overline{REF}$ signal is considered to be externally input directly from outside of the chip or to be internally generated. Further, symbol $V_{cc}$ is a power supply terminal in FIG. 2A, and a time $T_c$ on the waveform of a peak current flowing through the power supply terminal $V_{cc}$ in the refreshing operation represents a refreshing interval in FIG. 2B.

Generally speaking, in the case of a dynamic memory, it is necessary to refresh (rewrite) data within a predetermined time even when the memory system shifts from its normal operation (active condition) mode wherein accessing for reading and writing operations can be allowed to its wait operation (inactive condition) mode for holding the data. In the case of the aforementioned dynamic memory, when the refreshing control signal $\overline{REF}$ is activated, the memory system shifts from the normal mode to the wait mode, whereby a refreshing timer and an address counter incorporated in the chip are excited to automatically activate all the word lines sequentially and thereby refresh the data of all the memory cells. For example, in the case of a 1M bit memory, its refreshing period is set to be usually 8 msec due to the restriction of the data holding time of the memory cells so that all the memory cells can be refreshed through 512 refreshing operations. In this case, it is necessary to set one refreshing interval to be 8 msec per 512 and to select 2048 cells at one time at intervals of about 15 $\mu$sec, and the memory is set to have 2048 ($=m$) bits in the X direction and 512 ($=n$) bits in the Y direction.

In the dynamic memory, for such data holding operation as mentioned above, all the memory cells have been refreshed within a predetermined time (for example, within 8 msec in the above example) due to the restriction of the data holding time of the memory cells, not only in the wait mode but also in the activated memory mode or normal mode (write/read accessing mode).

This has resulted in that the substrate potential is remarkably varied and/or the power supply voltage is remarkably reduced due to the internal resistance of a power supply cell when the memory is backed up by means of the battery, which leads to the erroneous operation of the system. To overcome such disadvantages, it has been considered to make small device constants to thereby reduce the power consumption of the internal circuit, or to operate the memory at a low speed to realize small charging/discharging currents and thereby reduction in the level of the peak current. The latter measure of reducing the peak current in the refreshing operation, however, has found difficulties in also attaining the high access time of the memory and thus it has been difficult to actually carry out the current reducing measure.

SUMMARY OF INVENTION

It is an object of the present invention to provide a memory cartridge which has a DRAM and is compatible with an SRAM memory cartridge.

Another object of the present invention is to provide a memory cartridge which has a circuit for adjusting accessing operation to a semiconductor memory device at high timing accuracy and which can realize a stable refreshing operation.

A further object of the present invention is to provide a memory system which has the same level of performance as a conventional system without causing any adverse effect on its normal operation and which can reduce a peak current level in its wait operation in which data are held or backed up by means of power supply cell or the like.

Yet another object of the present invention is to provide a semiconductor memory system which has an access time as high as a conventional system in its normal operation mode and which is very small in the level of a peak current in a wait mode, i.e., in which data are merely held or backed up by means of power supply battery or the like.

Yet a further object of the present invention is to provide a semiconductor memory control system which can solve the above problems of the conventional systems, can realize its refreshing operation in a read accessing mode and can reliably hold data in a PSRAM.

In order to attain the above objects, a memory cartridge in accordance with the present invention comprises a DRAM, a power supply cell for supplying power to hold data of the DRAM, a refreshing circuit for refreshing the DRAM, an access mediating circuit for mediating between access from an external device to the DRAM and access to the refreshing circuit, and an access conversion circuit for converting SRAM access into DRAM access, wherein, when the memory cartridge is not supplied with power from the external device, the DRAM and the refreshing circuit are supplied with power from the power supply cell to be operated to hold data stored in the DRAM, while, when the memory cartridge is inserted in the external device, the memory cartridge is accessed from the external device as the SRAM and is accessed as the DRAM from the access conversion circuit.

The arrangement of the present invention, the DRAM has a self refreshing circuit and a battery therein and is operated so that, when the DRAM is supplied with power from the external device, the DRAM performs its refreshing operation on the basis of an external refreshing signal received from the external device, while, when externally supplied with no power, it performs its self refreshing operation. The present invention further comprises an access control circuit which detects a change in an address signal supplied from the external device and inverts for a predetermined period of time the logic level of the access signal for SRAM access such as a chip select signal, a chip enable signal, etc. supplied from the external device, whereby the DRAM is externally accessed as the SRAM.

Since there is provided such an access conversion circuit that converts an external SRAM access signal into a DRAM access signal in this manner, the memory cartridge using the DRAM can be used in the same manner as in the memory cartridge using the SRAM and therefore a DRAM memory cartridge having compatibility with an SRAM memory cartridge having a large memory capacity can be used.

To this end, the access arbitration circuit in the semiconductor memory system of the present invention is arranged so that at least two digit bits in a count value of a counter are allocated to four of a duration allowing generation of an access enable signal, a precharge duration for the access enable signal, a duration for generation of a refreshing enable signal, and a precharge duration for the refreshing enable signal, and the access arbitration circuit comprises a counter for counting a clock signal a device for generating the refreshing enable signal and receiving such memory access signals as a chip select signal and a chip enable signal when values of the two digit bits are allocated to the duration of generating the refreshing enable signal and for generating the access enable signal when the values of the two digit bits are allocated to the duration of generating the access enable signal.

In this way, since the four durations, i.e., the duration enabling the generation of the access enable signal, its precharge duration, the duration of generating the refreshing enable signal and its precharge duration can be allocated and managed depending on the value of the counter, these allocation timings can be accurately set at the same accuracy as the frequency of the counted clock signal, thus realizing the accurate access arbitration.

Thus, external signal timing can be set with high flexibility. In addition, when the frequency of the clock signal is increased, the probability of the DRAM being subjected to its refreshing operation can be made high. As a result, even when the DRAM is subjected to a long time access, there can be realized such a DRAM semiconductor memory system that can perform the SRAM function. In the case where a memory cartridge uses such SRAM, the memory cartridge can be advantageously made large in its memory capacity.

A resistance R and a capacitance C are connected respectively in series and in parallel to the power supply terminal of each of a plurality of memory chips. A second capacitance $C_2$ is provided in a common power supply line of the memory chips for supply of electric charges therethrough to the first capacitance C in the refreshing operation, for the purpose of preventing any drop in the power supply voltage even in the transient state of the power switching circuit when switched.

The waveform of the peak current flowing through each of the memory chips is smoothed through each smoothing circuit having a time constant $\tau = CR$ to reduce the peak level of the peak current. In addition, the value of the capacitance C is set so as to be positively recharged in the refreshing duration of each memory chip. The time constant $\tau$ is also determined taking into consideration the removal of noise in the power supply, external influences, and so on. This results in that a drop in the power supply voltage of each memory chip can be avoided and the optimum setting of the resistance R enables the power supply voltage drop in the normal and refreshing operations to be set at such an negligible level. As a result of having inserted the resistance R in a line connected to the power supply terminal of each memory chip, a slight operational margin shortage such as an access time delay takes place but it is very minute or small when viewed from the entire memory system. The erroneous operation of the memory system due to the peak currents, on the other hand, is a very important problem but this problem can be eliminated by properly designing the system to have a sufficient operational margin.

An operational mode detector for detecting the operational mode enables the number of cells selected on word lines in a wait operational mode to be smaller than that in a normal operational mode in a memory cell array divided by an X-direction decoder.

The reduction of the value of the peak current is effectively attained by decreasing the number of selected cells in the refreshing operation, that is, by decreasing the number of bit lines chargeable or dischargeable at a time, which corresponds to increasing the number of refreshing operations to shorten its refreshing interval when the refreshing period is considered to be constant.

However, since the refreshing operation for activation of the memory and the write access operation belong to the same operational mode in the normal operation, the number of refreshing operations is increased as the refreshing interval is made shorter, whereby the access time is delayed undesirably to the system. Meanwhile, the wait operational mode for holding data based on the battery is an inactive condition to the memory, so that, even when the refreshing interval is shortened, this has no effect on the system and thus the refreshing interval in the wait mode can be set shorter than that in the activation mode.

For the above reason, in the normal operation mode, a predetermined number of cells connected to word lines corresponding to the outputs of the X-direction decoder XD are refreshed providing no influence to the access time of the memory. In the wait operational mode, on the other hand, a mode switching signal of the operational mode detector causes the activation of the internal circuit, whereby the number of memory cells connected to word lines corresponding to the outputs of the X-direction decoder XD is reduced, the capacity of the bit lines is minimized, and the charging/discharging current, i.e., the peak current in the refreshing operation is decreased.

For the purpose of attaining the above object, in accordance with the present invention, a read access enable signal generated in the read access mode is set to have a constant time width, a data is read out from the memory at the end of the read access operation based on the read access enable signal, and the read data is latched in a latch circuit.

It is during the duration of the read access enable signal that the PSRAM is actually in the read access mode. When the duration of the read access enable signal is terminated, the PSRAM is released from the read access mode, but the read data is latched from the release time point and thus the refreshing operation can be carried out.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF DRAWINGS

The present invention will become more fully understood from the detailed description given hereinbelow and the accompanying drawings which are given by way of illustration only, and thus are not limitative of the present invention, and wherein:

FIG. 1B shows waveforms of peak currents flowing through memory chips in a refreshing operation;

FIGS. 5A and 5B are timing charts for explaining the access operation;

FIG. 6 is a block diagram showing an access mediating circuit in the access control circuit;

FIG. 7 is a diagram for explaining how to allocate access periods;

FIG. 9 is a block diagram of the access mediating circuit in the semiconductor system;

FIG. 10B shows waveforms of peak currents flowing through memory chips in a refreshing operation;

FIG. 12 is a specific application example of the memory system of the present invention;

FIG. 13 shows a particular array of electronic parts used in the present invention;

FIG. 20 is a timing chart for explaining the operation of the embodiment of FIG. 19;

DESCRIPTION OF THE PREFERRED EMBODIMENTS

Figure 3:
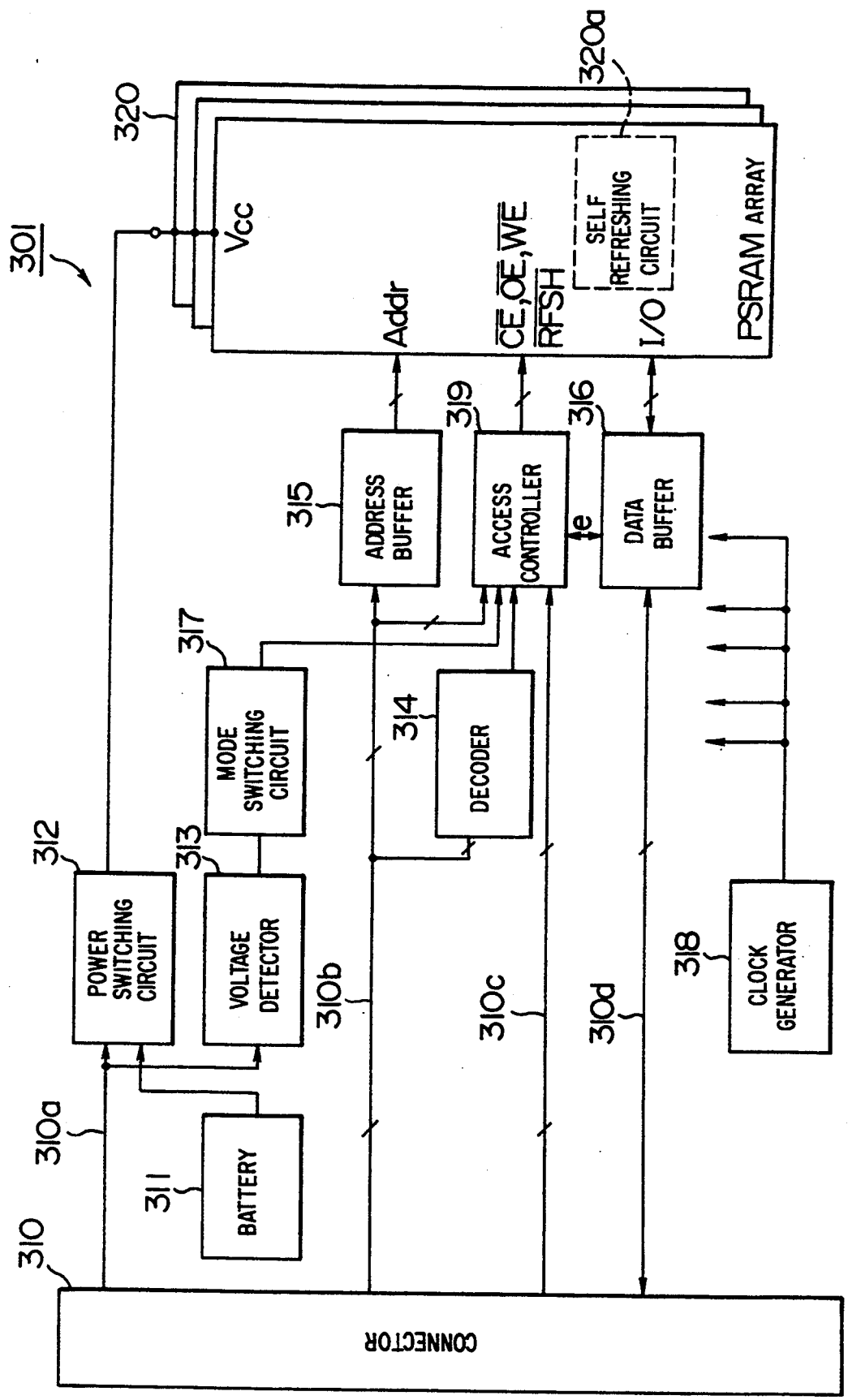
FIG. 3 shows a circuit configuration of a memory card using a PSRAM in accordance with the present invention.

Referring first to FIG. 3, there is shown a block diagram of an embodiment wherein a semiconductor system of the present invention is applied to a memory cartridge 301. More specifically, the memory cartridge 301, which is connected to such a data processing apparatus as a computer through a connector 310, includes a pseudo SRAM array (which will sometimes be referred to as the PSRAM, hereinafter) 320 which in turn incorporates a self refreshing circuit 320a.

Also included in the memory cartridge 301 to send control signals from the external data processing apparatus to the PSRAM 320 is an access control circuit 319 which is provided between control terminals of the connector 310 for chip enable ($\overline{CE}$), output enable ($\overline{OE}$) and write enable ($\overline{WE}$) signals and control terminals of the PSRAM 320 (including address terminals $\overline{CE}$, $\overline{OE}$ and $\overline{WE}$ and a refresh terminal RFSH). Further included in the memory cartridge 301 is a clock generating circuit 318 which supplies a clock signal to the PSRAM 320 and other circuits therein.

The self refreshing circuit incorporated in the PSRAM 320 functions to automatically perform its self refreshing operation based on the electric power of a backup cell to hold data therein during a wait mode in which the memory cartridge is supplied with no power from an external device. Thus, the memory cartridge can eliminate the need for performing any refreshing operation based on the external device. In a normal operation mode in which the memory cartridge is supplied with external power, however, the external refreshing operation is required and the refreshing request signal is generated, in the illustrated embodiment, at the access controller 319.

A power switching circuit 312, which has a diode and so on, is provided to switch between the external power supply and internal power supply battery. More in detail, the power switching circuit 312 is inserted between a power supply line 310a connected to a power supply terminal of the connector 10 and a power supply terminal $V_{cc}$ of the PSRAM 320 so that, when the memory cartridge 301 is connected to the external data processor, the PSRAM 320 can receive power from the external data processor. That is, the power switching circuit 312 acts to supply power from the power supply terminal of the connector 310 to the power supply terminal $V_{cc}$ of the PSRAM 320 and also when the circuit 312 is not supplied with this power, to supply power from a power supply battery 311 to the power supply terminal $V_{cc}$ of the PSRAM 320.

Connected to the power supply line 310a connected to a power supply terminal of the connector 310 is a voltage detector 313 which detects a voltage on the line 310a and sends the detected voltage output to a mode switching circuit 317. The circuit 317 in turn judges, based on the voltage output received from the voltage detector 313, whether or not the memory cartridge 301 is connected to the external data processor and sends a corresponding mode signal to the access controller 319.

An address buffer 315 is inserted between an address signal line 310b connected to the connector 310 and an address terminal Addr of the PSRAM 320 so that the PSRAM 320 can receive an address signal from the external data processor. Also connected to the address signal line 310b of the connector 310 are a decoder 314 and the access controller 319, so that the access controller 319, when receiving a decoded-address output from the decoder 314, can be started.

A data buffer 316 for input/output of data is provided between a data signal line 310d connected to the connector 310 and the data terminal I/O of the PSRAM 320 to perform data transfer between the external data processor and the PSRAM 320.

Figure 4:
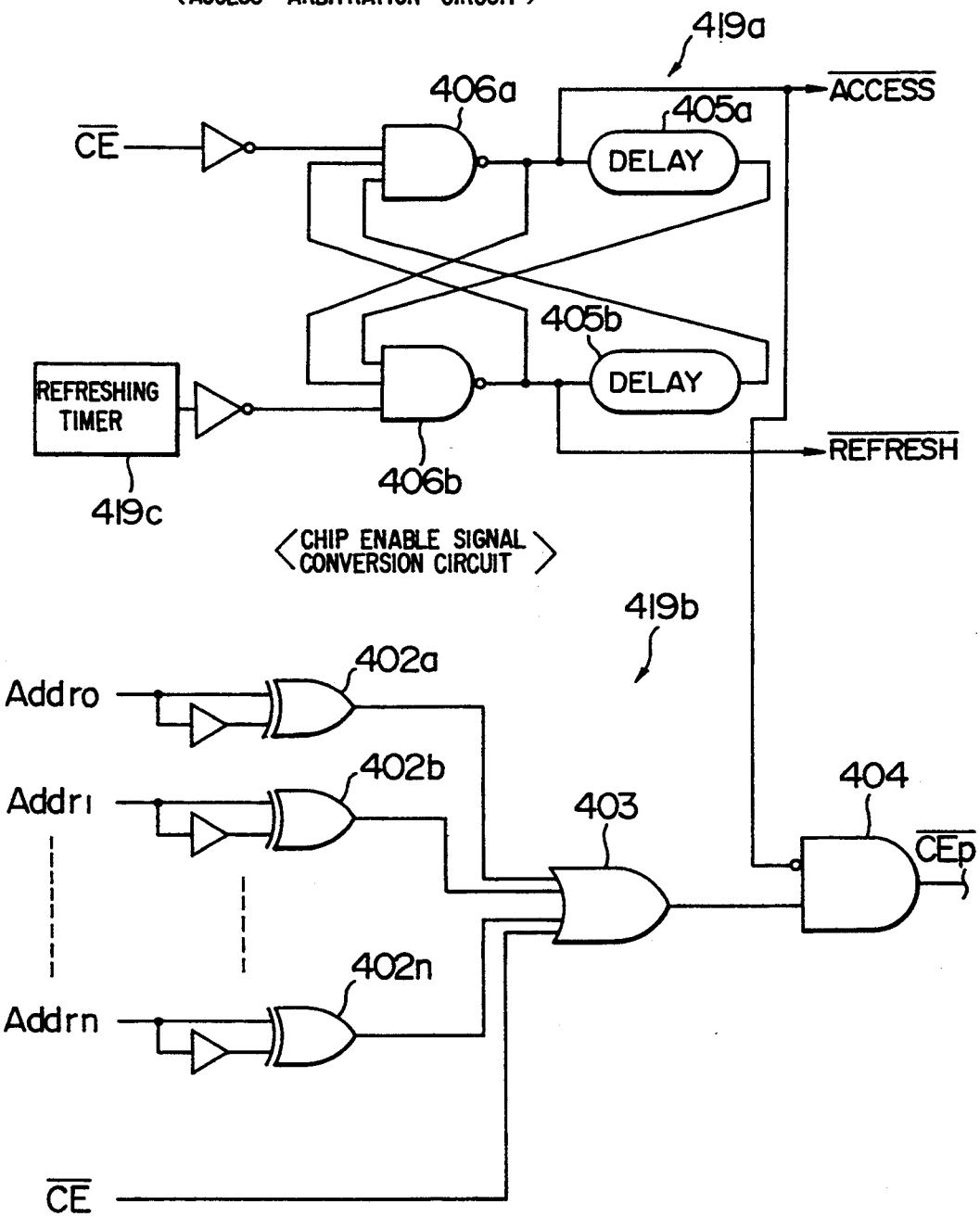
FIG. 4 is a block diagram showing a specific example of an access control circuit.

The access controller 319 has, as shown in FIG. 4, an access arbitration circuit 419a, a chip enable signal conversion circuit 419b and a refreshing timer 419c to receive the address signal and the control signals of the chip enable signal ($\overline{CE}$, output enable signal $\overline{OE}$ and write enable $\overline{WE}$ signals from a control signal line 310c of the connector 310).

The access arbitration circuit 419a may be an R-S flip-flop which comprises, for example, NAND circuits 406a and 406b having delay circuits 405a and 405b inserted in their output feedback circuits, an output of the NAND circuit 406a being used as an access enable signal $\overline{ACCESS}$ to the PSRAM 320, an output of the NAND circuit 406b being used as a refreshing enable signal $\overline{REFRESH}$ to the PSRAM 320. Either one of the chip enable signal $\overline{CE}$ supplied from the external device and the refreshing request signal $\overline{REFH}$ supplied from the refreshing timer 419c which is supplied first disables the other signal.

The access enable signal is applied to a gate circuit 404 in the chip enable signal conversion circuit 419b as its gate signal to be converted into a chip enable signal $\overline{CE_P}$.

The chip enable signal conversion circuit 419b having such an arrangement as illustrated functions to convert the chip enable signal $\overline{CE}$ from the connector 310 at the timing of the SRAM into the chip enable signal which conforms in format to the pseudo SRAM.

Meanwhile, in the SRAM, when the chip enable signal $\overline{CE}$ (or chip select signal $\overline{CS}$ included in the chip enable signal which will be explained later) is fixed to a low level (L), reading of a data from a predetermined address can be attained by varying the address signal. In the pseudo SRAM, however, since reading operation is carried out at a clocked interface, it is necessary to clock the chip enable signal $\overline{CE}$. FIG. 5A shows waveforms of the signals $\overline{Addr}$, $\overline{CE}$ and $\overline{OE}$ when the SRAM is accessed for reading data. The signal $\overline{Addr}$ is a timing address signal and the chip enable signal $\overline{CE}$ is maintained at level "L" even when the address signal varies. The output enable signal $\overline{OE}$ is maintained also at level "L".

Explanation will next be made as to the reading operation of the chip enable signal conversion circuit 419b. FIG. 5B shows a timing chart when the pseudo SRAM is accessed. In the drawing, the signal $\overline{Addr}$ is a timing address signal and the chip enable signal $\overline{CE_P}$ is a clock signal having a predetermined clock width which, as the address signal varies, is maintained at high (H) level for a constant duration $t_P$ necessary for the precharging of the memory and then changed to low level "L". The output enable signal $\overline{OE_P}$ is kept at level "L" even when the address signal varies and thus the accessing operation of the SRAM can be similarly applied to the pseudo SRAM. The address signal is received from the address signal line 310b.

Further, the write enable signal $\overline{WE_P}$ is maintained at level "H" in the reading operation even when the address signal varies. An output data signal I/O$_P$ has an effective data duration in which an effective data is present and which appears a chip enable signal access time duration $t_{co}$ later after the chip enable signal $\overline{CE_P}$ falls to level "L".

The chip enable signal conversion circuit 419b, as shown in FIG. 4, detects a change in the address signal and generates the chip enable signal $CE_P$. In the circuit 419b, more in detail, EXOR circuits 402a, 402b, ..., and 402n perform exclusive "OR" operations of the digit bits of the address signal and their delay signals, respectively, and an OR circuit 403 performs an "OR" operation of output signals of the EXOR circuits 402a, 402b, ..., and 402n and the external chip enable signal $\overline{CE}$. That is, in response to a variation in the address signal, the EXOR circuits 402a, 402b, ..., and 402n are operated so that the OR circuit 403 produces the chip enable signal $\overline{CE_P}$ having a "H" level duration corresponding to the operated period of the EXOR circuits and having an "L" level duration. The chip enable signal $\overline{CE_P}$ thus obtained is applied from the OR circuit 403 through a gate circuit 404 to the chip enable terminal $\overline{CE}$ of the PSRAM 320. The "H" duration of the chip enable signal $CE_P$ can be adjusted by inserting a suitable delay circuit and further taking a logical sum, and the rising timing of the chip enable signal $\overline{CE_P}$ at which the signal becomes significant can be adjusted.

Now, when the memory cartridge 301 is mounted in the data processor through the connector 310, the access control circuit 319 receives a connection mode signal from the mode select circuit 317. At this time, if the mode signal is indicative of the memory cartridge 301 connected to the external data processor and the address signal to be accessed by the external data processor selects the memory cartridge 301, then the address signal is decoded at the decoder 314 and applied to the chip enable signal conversion circuit 419b of the access controller 319. The circuit 419b, when receiving the chip enable signal $\overline{CE}$ from the data processor together with the decoded address signal, generates the chip enable signal $\overline{CE_P}$ at such timing as shown in FIG. 5B.

As already explained above, when the chip enable signal conversion circuit 419b receives the chip enable signal $\overline{CE}$, the circuit 419b detects a variation in the address signal Addr and converts the chip enable signal $\overline{CE}$ into such a chip enable signal $\overline{CE_P}$ having a level "H" for a constant duration after the timing of the address signal variation and then having a level "L" thereafter as shown in FIG. 5B. The converted chip enable signal $CE_P$ can be sent to the terminal CE of the PSRAM 320 during generation of the aforementioned access enable signal of the access adjusting circuit 419a.

As a result, the data buffer 316 receives an enable signal from the access controller 319 after the chip enable signal access period $t_{co}$ from the falling of the chip enable signal $\overline{CE_P}$ and stores therein an effective data received from the I/O terminal of the SRAM 320. At this time, a write enable signal ("H") externally entered is sent as it is sent to the terminal WE of the PSRAM 320 as the write enable signal $\overline{WE_P}$.

The writing operation to the memory cartridge 301 is carried out when the write enable signal WE changes from its level "H" to level "L" and explanation thereof is omitted because it is substantially the same as in the case of the SRAM.

In this manner, the duration $t_P$ of the chip enable signal necessary for the precharging of the memory is secured and then the chip enable signal is subsequently maintained at level "L" to convert access based on address clock into a CE clock at the access arbitration circuit, and after the constant period $t_{co}$, the effective data is stored in the data buffer 316.

Explanation will next be made as to another example of the access control circuit.

FIG. 6 shows another such detailed exemplary access arbitration circuit 630 that allows access arbitration not only to the PSRAM 320 incorporating a self refreshing circuit but also to the DRAM and that the refreshing enable signal and access enable signal can be controlled on the basis of a clock signal issued from an external device (or on the basis of a clock signal issued from a clock in the clock generator 318).

The access arbitration circuit 630 of FIG. 6 has a counter 621 and a data latch flip-flop (D-F/F) 622. The counter 621, when receiving a clock signal at a clock input terminal 626 sent from the external device (or the clock generating circuit 318 incorporated in the memory cartridge 301) which is connected with the memory cartridge 301, counts the clock signal and is operated according to the counted value.

More concretely, the counter 621 is an n-notation counter which receives at its clock terminal CK, for example, a clock signal having a period of about 50 nsec and secures a duration allowing the generation of an access enable signal, its precharging duration, a duration allowing the generation of a refreshing enable signal and its precharging duration. One output of the counter 621 at its output terminal $Q_{n-1}$ is sent to respective first input terminals of a 2-input OR gate 623 and a 3-input OR gate 624, while the other output of the counter 621 at its output terminal $Q_n$ is applied to a second input terminal of the OR gate 623 through an inverter 623a. The $Q_n$ output of the counter 612 is also applied to a second input terminal of the OR gate 624 and to a first input terminal of an OR circuit 625 directly without intervention of any inverter.

The OR gate 623 is a negative logic circuit, which receives the $Q_{n-1}$ output from the counter 621 and the $Q_n$ output through the inverter 623a from the counter 621, to regard a negative logic output (having low level "L") as significant. More specifically, the OR gate 623, when the $Q_{n-1}$ output of the counter 621 is at level "L" and the $Q_n$ output thereof is at level "H", generates at its output terminal a negative logic refreshing enable signal $\overline{REFRESH}$ having level "L". In other words, so long as the values of the outputs $Q_n$ and $Q_{n-1}$ are "0" and "1" respectively, the counter 621 generates the refreshing enable signal.

The OR gate 624 is also a negative logic circuit which receives at its third input terminal the chip enable signal $\overline{CE}$ from an input terminal 627. Only when the values of the outputs $Q_n$ and $Q_{n-1}$ are both "0", the OR gate 624 generates a negative logic signal $\overline{ACCESS}$ of level "L". In other words, when the values of the outputs $Q_n$ and $Q_{n-1}$ are not both "0", either one of these outputs is at level "H", so that, even when the OR gate 624 receives the chip enable signal $\overline{CE}$, the gate 624 will not generate the negative logic access enable signal $\overline{ACCESS}$. That is, only when the values of the outputs $Q_n$ and $Q_{n-1}$ are both "0", the access enable signal is generated.

Meanwhile, the OR circuit 625 receives the output $Q_n$ from the counter 621 and the chip enable signal 627 and sends its output to a terminal D of the D-F/F 622.

The D-F/F 622 receives at its clock terminal CK the clock from the clock input terminal 626 through an inverter 622a and latches an output of the OR circuit 625. More specifically, the D-F/F 622, when the latch data becomes "0", an output of the D-F/F generated at its output terminal Q is shifted from level "H" to "L" and the D-F/F resets the counter 621 at a timing when the Q output is shifted from level "H" to "L", whereby the counter 621 is restarted from its count value "0". At this restart time, the values of the outputs $Q_n$ and $Q_{n-1}$ of the counter 621 are both "0", so that, when the chip enable signal $\overline{CE}$ is generated, the signal $\overline{CE}$ is passed through the OR gate 624 and the access enable signal is generated.

The above operational relationship between the access enable signal and refreshing signal is summarized as shown in FIG. 7.

When the counter 621 is an up counter and resetting thereof in the course thereof is not considered, the count values of the outputs $Q_n$ and $Q_{n-1}$ of the counter 621 are changed sequentially in the order of "0", "0"; "1", "0"; "0", "1"; "1", "1"; and "0", "0".

More concretely, a duration wherein the count values of the outputs $Q_n$ and $Q_{n-1}$ of the counter 621 are "0" and "0" respectively (duration of the count values from "0", "0" to "1", "0") is an access enable duration during which, when the chip select signal is changed to level "L", the access enable signal is generated. A duration wherein the count values of the outputs $Q_n$ and $Q_{n-1}$ of the counter 621 are "0" and "1" respectively is a refreshing enable duration, during which, even when the chip select signal is changed to level "L", no access enable signal is generated and only the refreshing enable signal is generated as effective. A duration wherein the count values of the outputs $Q_n$ and $Q_{n-1}$ of the counter 621 are "1" and "0" respectively is a precharging duration to the access enable signal, and a duration wherein the count values of the outputs $Q_n$ and $Q_{n-1}$ of the counter 621 are "1" and "1" respectively is a precharging duration to the refreshing enable signal.

It is considered that, when the access enable signal is generated immediately before the change of the values of the outputs $Q_n$ and $Q_{n-1}$ from "0", "0" to "1", "0", the precharging duration becomes insufficient. For the purpose of preventing it, the present invention is arranged so that, when the chip select signal is changed to level "L", the D-F/F 622 resets the counter 621 to start the recounting of the counter 621. This is one of the reasons why the D-F/F 622 and the OR circuit 625 are provided to reset the counter 621. Further, when the values of the outputs $Q_n$ and $Q_{n-1}$ are changed from "1", "1" to "0", "0" the counter 621 is reset to restart its counting operation from zero count. This is the second reason why the D-F/F 622 and the OR circuit 625 are provided to reset the counter 621 through the OR circuit 625. If the duration wherein the values of the outputs $Q_n$ and $Q_{n-1}$ are "1" and "0" is sufficient, then the precharging duration can be obtained, so that the need for such resetting based on the chip select signal as mentioned above can be eliminated. When the access enable duration is set sufficient and the counter 621 is a circulating counter, the count value of the counter 621 is again returned to "0", so that the resetting based on the $Q_n$ output of the counter 621 can be eliminated.

In this manner, the generation of the access enable signal is prevented during a period from the change of the $Q_{n-1}$ digit of the counter 621 to "1" to the resetting of the next $Q_{n-1}$ and $Q_n$ digits at "0" and "0". The period for preventing the generation of the access enable signal can be allocated as the refreshing duration and precharging duration. Similarly, since the counter is reset at the time of generating the access enable signal, a duration from the counting start "0" to "0", "0" corresponds to the access enable duration and thus the generation of the access enable signal is prevented until the refreshing enable duration wherein the values are "0" and "1".

That is, by dividing the frequency of the externally supplied clock signal externally through the counter, the refreshing enable signal $\overline{REFRESH}$ and the access enable signal $\overline{ACCESS}$ can be generated independently of each other.

In the event where the frequency of the clock signal is set high, even when the chip enable signal lasts for a long period of time, the probability of generating the refreshing enable signal becomes high and the refreshing generation period can be set shorter than in the conventional systems. Accordingly, one or more refreshing operations can be positively realized during the refreshing period of conventional systems, so that, even when access is frequently carried out, refreshing can be obtained between the accessing operations, thus resulting in that such period in which that refreshing cannot be effected is avoided.

In this access arbitration circuit, the values of two digits of the counter are allocated to the access enable duration, the refreshing enable duration, and the precharging durations thereto, but the number of such digits of the counter is not limited to the particular 2 and may be 3 or more so long as the allocation of 4 or more durations is allowed.

The counter 621 comprises an up counter in the illustrated embodiment, but the type of the counter is not limited to the particular type and may be a down type or other suitable type.

Although the clock signal to be counted at the counter 621 has been externally obtained in the foregoing embodiment, the clock signal may be a clock signal used in the interior of a microprocessor, a clock signal generated at the machine cycle, or a clock signal as a control reference signal supplied from a clock generating circuit to the microprocessor.

Though the foregoing embodiment has been explained in connection with the case of the PSRAM, when a refreshing circuit is provided within the memory cartridge outside the RAM, the cell refreshing circuit within the PSRAM can be made unnecessary and a DRAM can be used in place of the PSRAM. Accordingly, the present invention may comprise a memory cartridge having the DRAM and the refreshing circuit. In this case, the chip enable signal conversion circuit 419b in the embodiment is replaced by an access conversion circuit for converting an SRAM access signal into a DRAM access signal.

The memory cartridge in the present specification may be made in the form of a card or in any shape called a memory card or a cassette memory.

As will be appreciated from the foregoing explanation, in accordance with the present invention, since the access conversion circuit for converting an external SRAM access signal into a DRAM access signal is provided, the memory cartridge using the DRAM can be used in the same manner as the memory cartridge using the SRAM, whereby a memory cartridge compatible with that using the SRAM having a large memory capacity can be realized.

Figure 8:
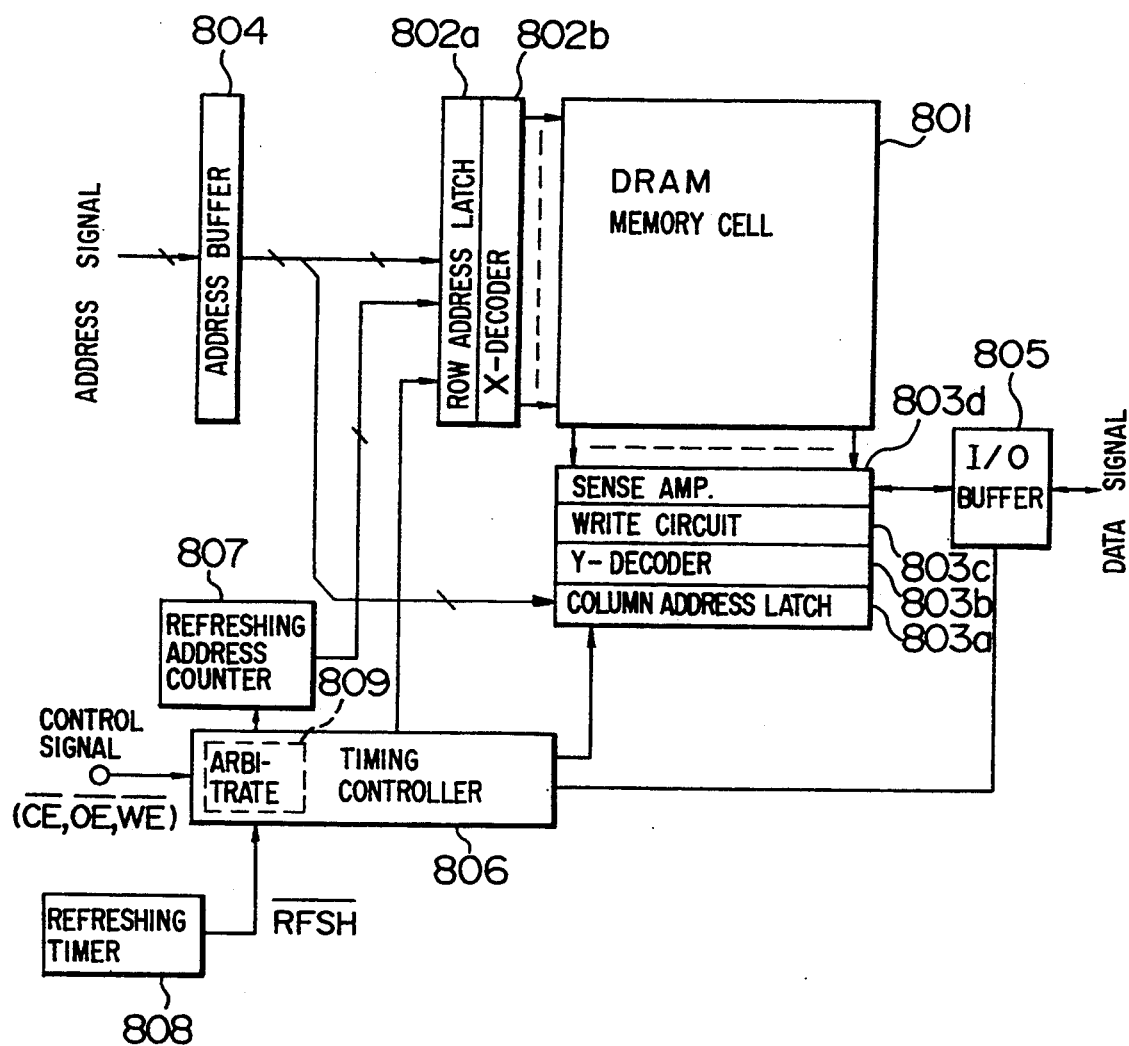
FIG. 8 is a block diagram showing an exemplary internal arrangement of a virtual SRAM.

Shown in FIG. 8 is an internal arrangement of a semiconductor system in accordance with another embodiment, which includes a DRAM memory cell matrix 801, a row address latch circuit 802a in an X decoder system, an X decoder 802b, a column address latch circuit 803a in a Y decoder system, a Y decoder 803b, a write circuit 803c and a sense amplifier 803d.

In operation, an external address signal is once stored in an address buffer 804 to be divided into component signals in row and column direction, which are then supplied to and stored in the row and column address latch circuits 802a and 803a respectively. These stored data are decoded at the respective X and Y decoders. In a write operation, the write circuit 803c is controlled by a timing controller 806, a data received from an I/O circuit 805 is decoded at the X and Y decoders 802b and 803b to be written at an intersection position of the matrix as a one bit data. The data reading operation is carried out in a manner opposite to the aforementioned data writing operation.

A refreshing address counter 807 sequentially scans the X decoder system by the number of the rows at refreshing timing in a refreshing cycle (refreshing duration) according to a signal received from the timing controller 806. In this manner, in the refreshing cycle, the cycle reading operation is carried out under the timing controller 806 so that the DRAM memory cell matrix 801 is refreshed. The refreshing timing is provided by receiving at the timing controller 806 a refreshing request signal $\overline{RFSH}$ cyclically generated at a refreshing timer 808.

The timing controller 806 receives from external circuits such signals as a chip enable signal $\overline{CE}$, an output enable signal $\overline{OE}$ and a write enable signal $\overline{WE}$. The timing controller 806 incorporates an access arbitration circuit 809 which controls access competition to the DRAM memory-cell matrix 801 between the chip enable signal $\overline{CE}$ received from the external device and the refreshing request signal $\overline{RFSH}$ received from the refreshing timer 808.

An access arbitration circuit 900 shown in FIG. 9 is made in the form of an R-S flip-flop which comprises NAND circuits 909a and 909b having delay circuits (DELAY) 910a and 910b inserted in their output feedback circuits. An output of the NAND circuit 909a used as the access enable signal $\overline{ACCESS}$ to the DRAM memory cell matrix 801 while an output of the NAND circuit 909b is used as the refreshing enable signal $\overline{REFRESH}$ to the DRAM memory cell matrix 801.

Figure 10A:
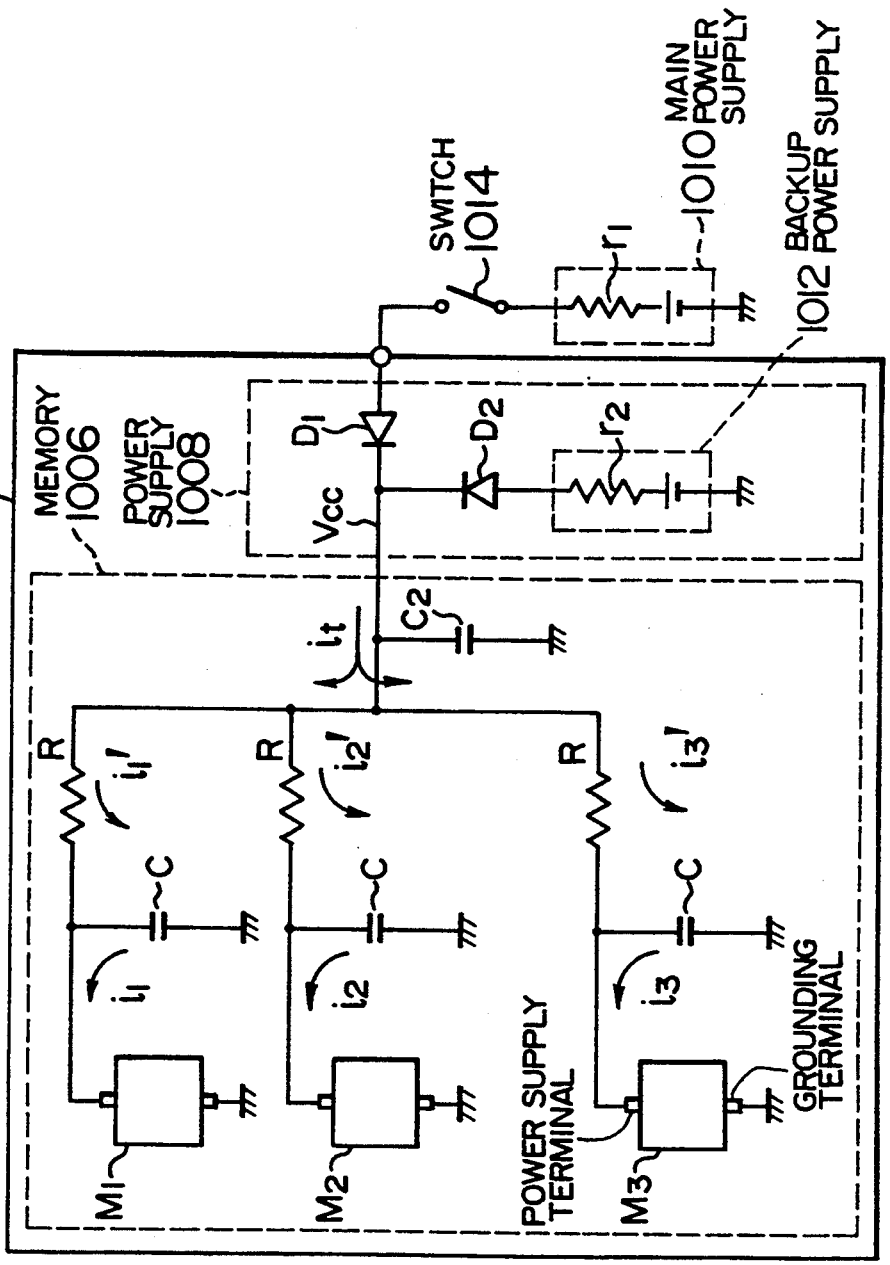
FIG. 10A is a circuit arrangement for explaining the principle of a memory system in accordance with an embodiment of the present invention.

FIG. 10 shows another embodiment of the present invention, wherein FIG. 10A shows an arrangement of a memory system of the embodiment and FIG. 10B shows waveforms of peak currents in the refreshing operation of dynamic memory chips in the embodiment. In FIG. 10A, reference numeral 1002 denotes a memory system in the form of a portable file, 1004 a reader/writer for performing reading and writing operations from and to the memory system 1002, 1006 a memory section including memory chips $M_1$ to $M_3$ and smoothing circuits connected to respective power supply terminals of the memory chips, 1008 or backup power supply 101a including an auxiliary power supply, a main power source 1010 and power switch 1014.

Figure 1A:
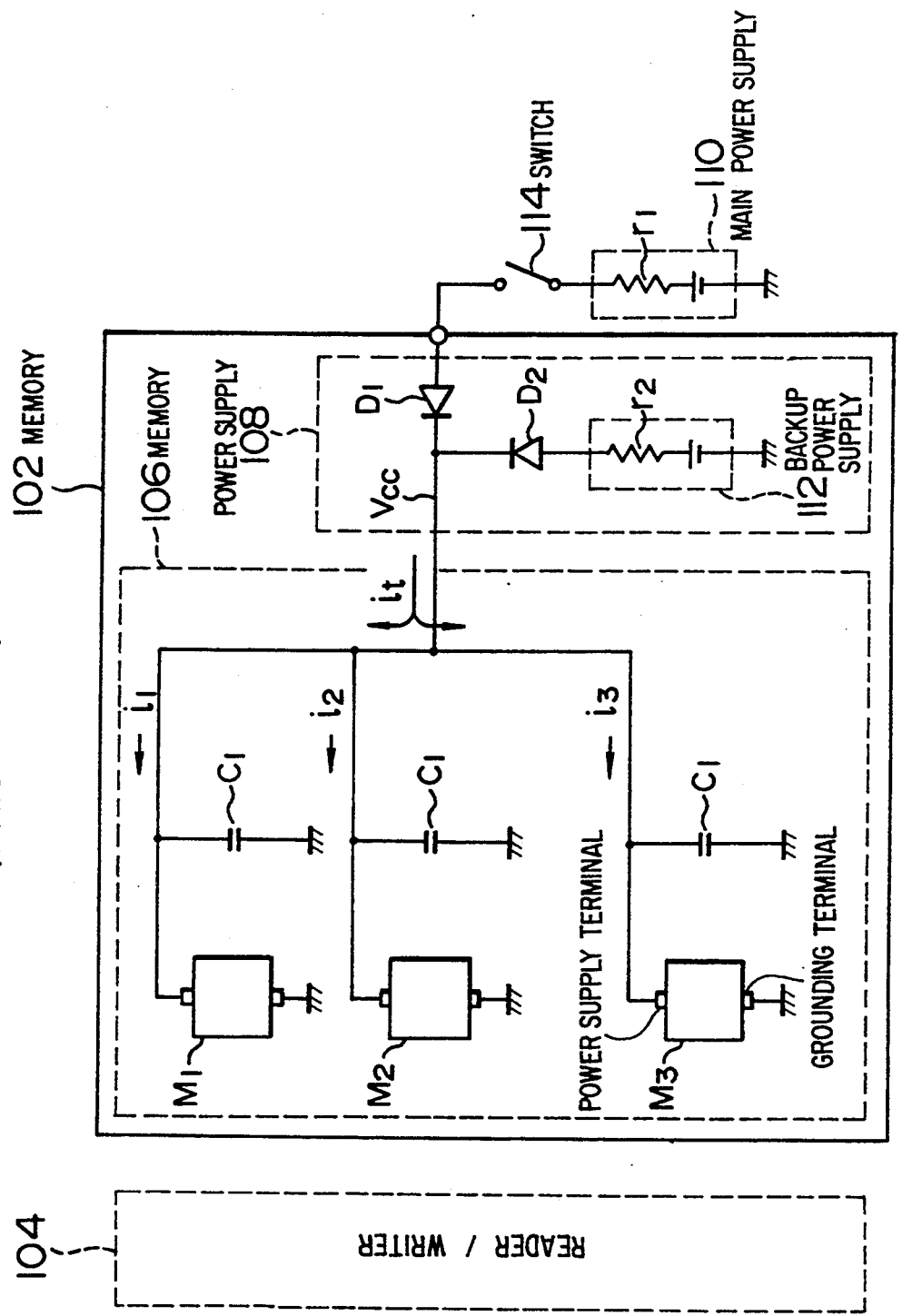
FIG. 1A is an arrangement of a conventional memory system.
Figure 2A:
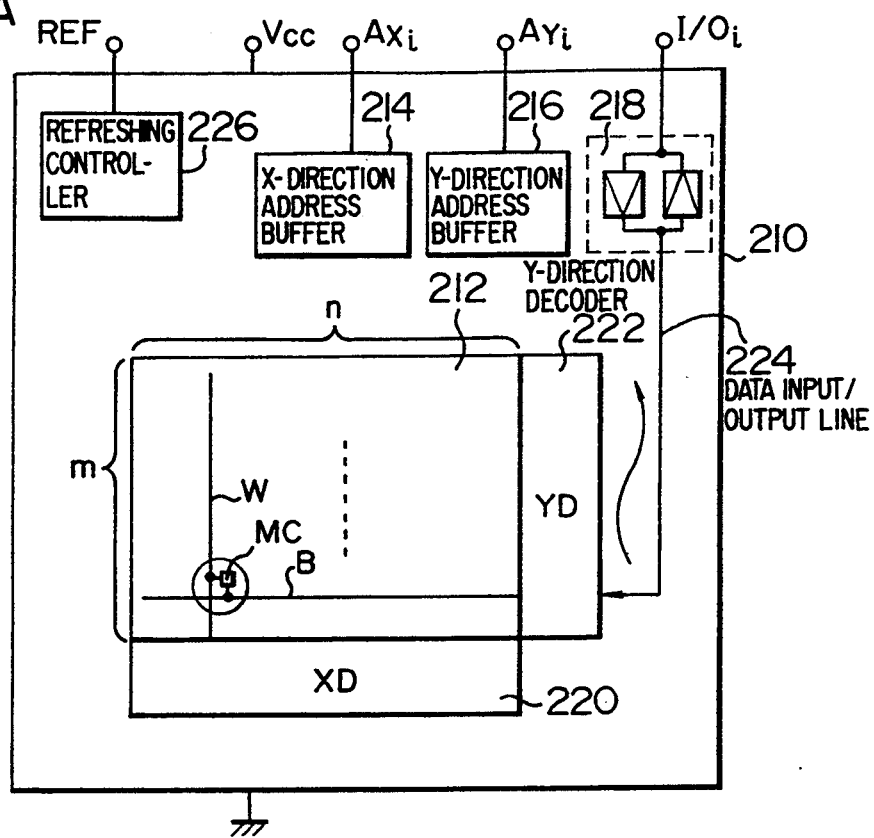
FIG. 2A is a block diagram of a conventional semiconductor memory system.
Figure 2B:
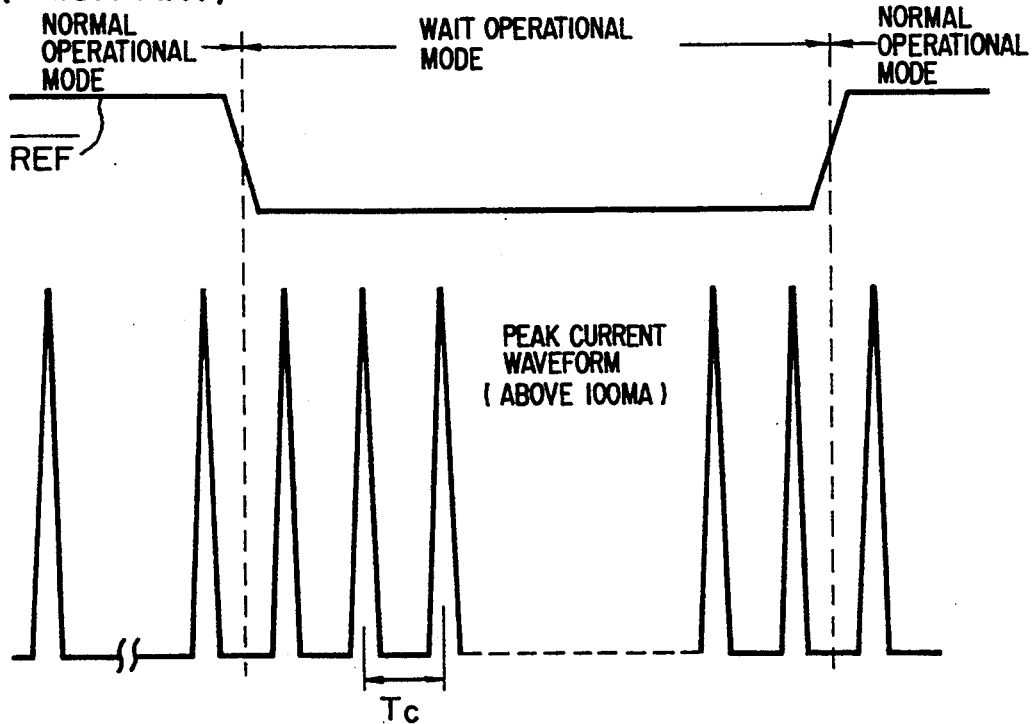
FIG. 2B shows waveforms of a peak current in normal and wait operation modes.

The peak currents flowing through respective memory chips in the refreshing operation have such waveforms as shown in FIG. 10B. More in detail, a peak current $i_1$ to the memory chip $M_1$ is supplied from electric charges charged in a capacitance C and the capacitance C is again charged in an inactive duration of the refreshing period. For this reason, a current $i_1'$ as viewed from the side of a common power supply line $V_{cc}$ is made smoother and lower in level than the current $i_1$. Similarly, peak currents $i_2'$ and $i_3'$ for the other memory chips $M_2$ and $M_3$ are also made lower. Therefore, a total peak current $i_t'$ of such peak currents $i_1'$, $i_2'$ and $i_3'$ is also made lower than the corresponding one in the conventional system of FIG. 1, so that a power voltage drop due to the internal resistance of an auxiliary power supply 1012 can be made small.

The value of the capacitance C is set taking into consideration a time during which recharging can be sufficiently effected in the refreshing period, the mount of charge allowing the sufficient replenishment of the peak current, and the role of removing noise in the power supply. Accordingly, a time constant $\tau = C*R$ is set to be sufficiently short as compared with the refreshing period and also to allow the reduction of the peak current level in the refreshing operation. The value of a resistance R is determined to be in a range where the voltage drop can be sufficiently ignored in the write/read access active operation and in the refreshing operation. For example, when the oscillation period in the refreshing operation is 50 $\mu$sec., a charging time of 5 $\mu$sec. or less providing one-figure allowance is set, the value of the capacitance C is set to be between 0.1 and 0.5 $\mu$F., and the value of the resistance R is set to be about between 5 and 10$\Omega$, so that the voltage drop can be suppressed by about 0.2 V or less at the maximum level of the peak current of the memory chip and therefore the internal erroneous operation can be eliminated. Since the supply of electric charges to the first capacitance C in the refreshing operation is necessary even in a transient state of the power switching circuit caused by its switching operation, a second capacitance $C_2$ is set to have a value sufficiently larger than a product of the number of memory chips used and the value of the capacitance C.

In the foregoing embodiment, the peak currents are made smooth through the series-connected resistances R and parallel-connected capacitances C to the respective memory chips independently of each other, whereby the level reduction of the peak currents can be attained only by slightly modifying the usual arrangement of the memory system. In FIG. 10A, the respective memory chips comprise respectively a self-exciting oscillator which performs its own refreshing operation (self refreshing operation). For this reason, when a multiplicity of memory chips are employed, it is considered that some of the peak currents such as the peak currents $i_1$ and $i_3$ may be momentarily overlapped with each other. To avoid this, the values of the resistance R and capacitance C are set taking into consideration the overlapping of the three peak currents as the worst condition, that is, a sum thereof. Further, although the smoothing circuit comprising the elements C and R has been provided outside each of the memory LSI chips, it is also possible to previously provide the elements C and R within the each chip, in which case the area of the memory system can be decreased by an amount corresponding to the area occupied by the elements C and R.

Figure 11A:
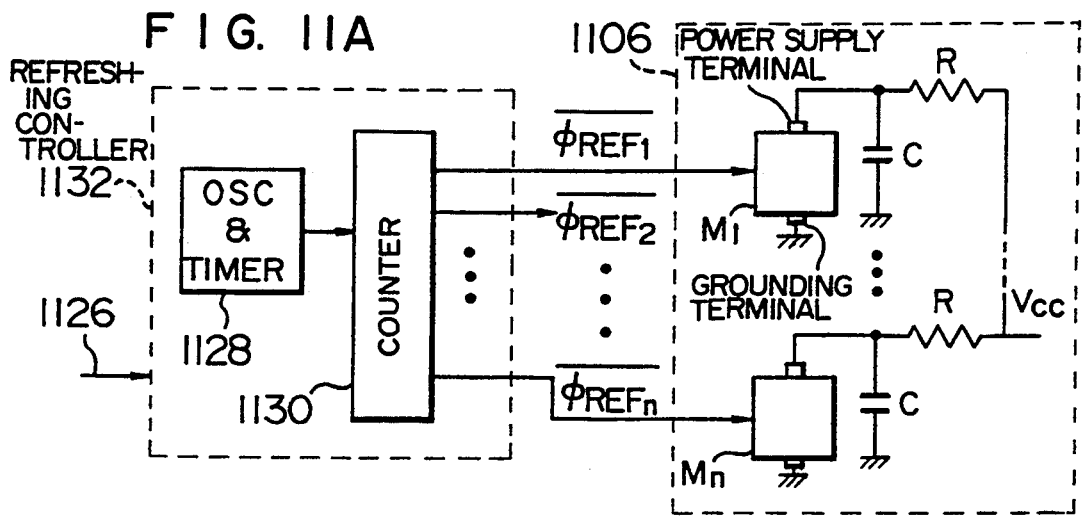
FIGS. 11A and 11B are a block diagram and a timing chart for explaining how to specifically control the memory system based on a refreshing control signal.
Figure 11B:
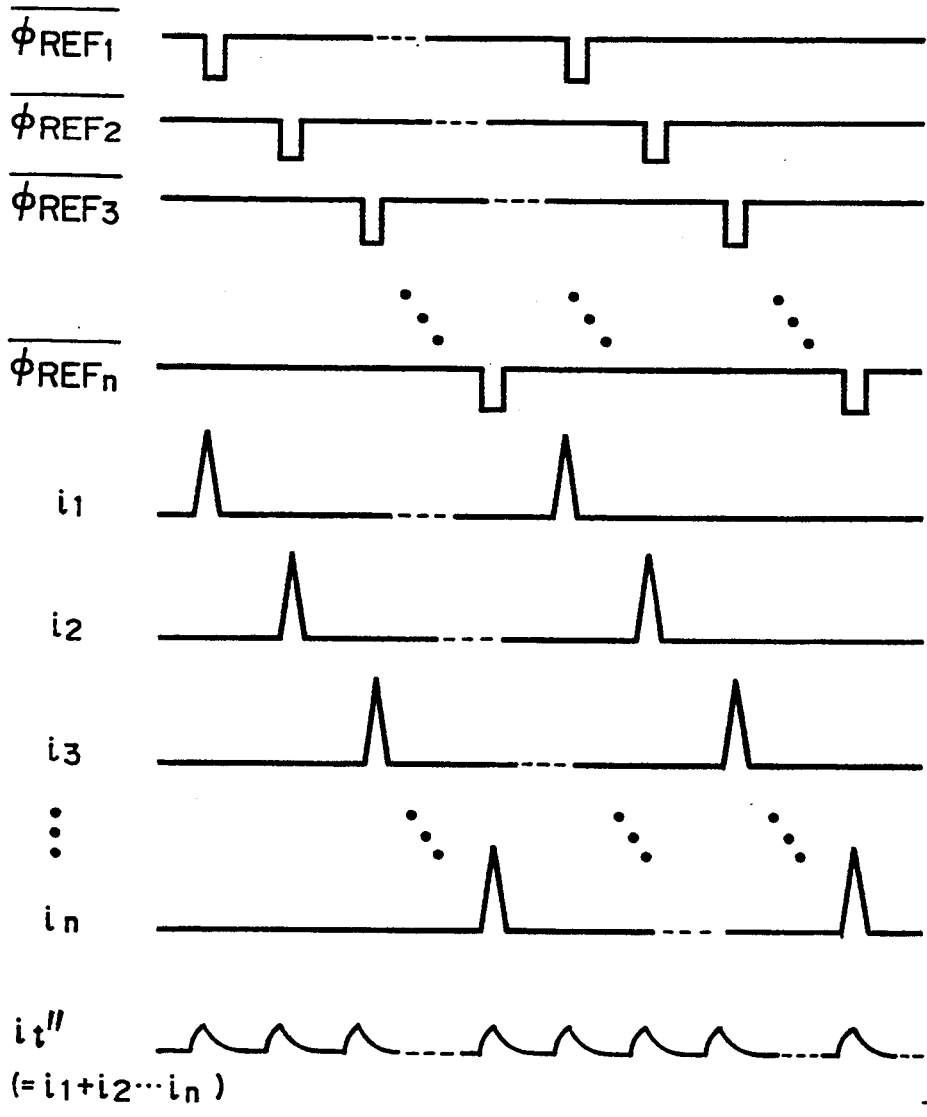

Referring to FIGS. 11A and 11B, there is shown another embodiment of the present invention which employs the smoothing circuit of FIG. 10A. The circuit of FIG. 11A includes a refreshing control circuit 1132, a refreshing operation activating signal generated from a power-cut-off detection signal or the like, an oscillator/timer 1128, a counter 1130, outputs $\phi_{ref1}$ to $\phi_{refn}$ of the counter 1130 as memory refreshing control signals, and a memory section 1106. The memory section 1106 comprises memory chips $M_1$ to $M_3$ and smoothing circuits connected to respective power supply terminals of the respective memory chips $M_1$ to $M_3$. FIG. 10 shows the case where the memory chips comprise respectively a self-exciting oscillation circuit which performs its own refreshing operation (self refreshing operation). In this case, however, when the memory system is made to have a large capacity by providing a multiplicity of memory chips in the memory system, it is considered that, even when the peak currents are made smooth according to the foregoing embodiment, the peak currents of the many memory chips may be overlapped with each other, thus resulting in a large total peak current. To avoid this, the refreshing control signals $\phi_{ref1}$ to $\phi_{refn}$ of the respective memory chips are controlled on a time sequential basis within the memory system as shown in FIG. 11B. As a result, in a sum $i_t''$ of peak currents $i_1$ to $i_n$ of the memory chips, overlapping between the peak currents can be removed and thus any erroneous operation of the memory system due to a large current can be prevented.

Further, the memory system of the present embodiment may, for example, comprise a plurality of memory units each of which has 8 memory chips and which are activated by the aforementioned refreshing control signals $\phi_{ref1}$ to $\phi_{refn}$. As a result, the overlapping in the peak current between the memory units can be prevented. Thus, this method is required to control only the memory units, so that, even when the memory system has a large memory capacity, the number of refreshing control signals can be reduced, the refreshing control circuit can be simplified, and the refreshing control in a backup mode can be simplified.

The aforementioned oscillator/timer, the counter, etc. have known structures.

FIG. 12 is an example in which the smoothing circuits of FIG. 10 for reduction of the peak current level are applied to a portable file memory having a secondary battery as an auxiliary power supply. More particularly, FIG. 12 includes a memory system 1202 made in the form of a portable file memory and a reader/writer 1204 for performing reading and writing operations from and to the memory system. The memory system 1202 includes a power-off detection circuit 1216 for detecting such a power state as a power voltage drop or a power failure, a power detector 1218 provided in the power-off detection circuit 1216, a charging terminal 1222 for an auxiliary power supply 1212 (secondary battery), a charging circuit 1224 for the power supply 1212, a p-channel type MOS transistor $Q_1$, and a power-off detection signal OUT. Also provided in FIG. 12 are peak-current smoothing circuits as in FIG. 10A. In the power supply circuit in FIG. 10A, meanwhile, the switching from the main power supply 1010 to the auxiliary power supply 1012 has been automatically carried out on the basis of a voltage level difference between the main and auxiliary power supplies 1010 and 1012 through diodes $D_1$ and $D_2$. However, when the voltage level of the main power supply 1010 is 5 V and the auxiliary power supply 1012 in the form of a NiCd secondary battery has 4 cells each having an initial value of 1.35 to 1.4 V per one cell for example, the voltage level of the auxiliary power supply 1010 becomes 5.4–5.6 V. For this reason, a current supplied to the common power supply line $V_{cc}$ in the normal operation allowing external access is not from the main power supply 1010 but from the auxiliary power supply 1012 which is higher in voltage level than the main 1010. For the purpose of preventing it, there is provided such an arrangement as shown in FIG. 12, wherein the p-channel MOS transistor $Q_1$ is provided in place of the diode $D_2$ in FIG. 10, the transistor is connected at its drain to the common power supply line $V_{cc}$ and at its source to the auxiliary power supply 1212 so that, in such a backup operation as for a power voltage drop or a power off, the power-off detection signal OUT is used to set the gate terminal of the transistor at a low level to activate the transistor. In the normal operation, on the other hand, the power-off detection signal OUT is set at its high level to thereby inactivate the transistor, whereby the auxiliary power supply can be completely cut off in the normal operation. A diode $D_3$ in FIG. 12 is provided to prevent any reverse current during charging operation, and a resistance $R_c$ is to control the charging current of the secondary battery. Since the backup auxiliary power supply 1212 has an initial voltage level of 5.6 V, a voltage higher than 5.6 V is applied to the charging terminal 1222. Accordingly, the charging power may be supplied from the reader/writer 1204 as illustrated in FIG. 12 or may be obtained from a boosting circuit provided within the memory system. It is also possible that, reversely, the voltage at the charging terminal can be used as the voltage of the memory chips and internal control circuit when reduced to 5 V.

The power-off detection circuit 1216 has a known structure and in particular, the power detector 1218 provided therein may comprise a comparator or the like.

FIG. 13 shows a practical detailed array of electronic parts used in a memory system 1302 of the present invention in the form of such a relatively small and portable file memory as a memory card. The illustrated memory system 1302 includes auxiliary power sources for backup 1312a to 1312d, a power supply circuit 1308 for detecting a power-off state, inactivating memory chips and for switching between main and auxiliary power supplies, memory chips $M_1$ to $M_4$, a frame 1332 for the memory system 1302, a printed circuit board 1334 for mounting thereon the memory chips and other parts, and a control chip 1336 for selectively decoding the memory chips and for controllably mediating between the read/write access operation and refreshing operation. Connected to the memory system 1302 is a connector 1338 for performing data input/output between the reader/writer 1204 and memory system 1302.

The electronic parts used in FIG. 13 can be mounted at a high density by making the electronic parts in the form of chips suitable for mounting on the board. For example, first capacities C and resistances R forming smoothing circuits can be mounted on the board at a high density. The capacities C are provided for the purpose of preventing the generation of high frequency noise caused by a large current. For example, the capacity C is wired in the vicinity of a power supply terminal of the memory chip $M_3$ to provide a shortest wiring between the power supply and grounding terminals, as represented by A. As a result, the inductance component of the power supply wiring can be minimized and therefore the object of removing the high frequency noise of the power supply can be effectively attained. The printed circuit board, for the purpose of avoiding internal and/or external noise, has a multi-layer structure comprising 3 or more layers, at least one of which is exclusively used mainly as a power supply line layer and in which power supply lines are made thick in line diameter to realize low resistance wiring of the power supply lines. Further, the resistance R is wired so as to provide a shortest wiring distance to a power supply terminal $V_{cc}$ and to provide the minimized inductance component of the resistance R. With such an arrangement, the erroneous operation of the memory system 1302, which would be caused by the peak currents when dynamic memory chips are used for a small portable file memory system, can be suppressed. The second capacitance $C_2$ in FIG. 13 is provided to supply charges to the first capacitances C at the time of power changeover and to be operated at relatively low frequency. The capacitance $C_2$ can be located with a high degree of freedom. It goes without saying that it is necessary, in addition to the aforementioned capacitances, to provide to the power supply lines of the memory system 1302 a large-capacitance capacitor for removal of low frequency noise and a small-capacitance capacitor for removal of high frequency noise. Although explanation has been made mainly in connection with the memory circuit in the foregoing embodiment, the memory system of the present invention may be applied to memory LSI, logic LSI or other LSIs, so long as the memory system has a backup circuit based on battery and dynamic memory chips which can hold data at least partially therein through its own refreshing operation and can reduce the peak current level, or so long as the memory system has a circuit which can produce cyclically a peak current and can reduce the level of the peak current. In addition, the type of the battery used as the auxiliary power supply is not limited, in particular, and for such a memory LSI having a large consumption current as a dynamic memory, such a rechargeable type of battery as a secondary battery is convenient because it requires less frequent replacement.

The levels of the signals given in the foregoing embodiment are set to activate a predetermined circuit and thus the levels are not restricted to the illustrated high or low levels. Though the transistor $Q_1$ is comprised of a p-channel transistor, the p-channel transistor may be used as an n-channel transistor if necessary by reversing the gate control of the transistor. Further, the portable memory system is supplied with power from a single power supply (battery) both in the normal operation and in the wait or backup operation, even in which case the present invention can advantageously reduce the peak current in the backup mode and lighten the burden of the battery to abruptly discharge a large current. As a result, there can be provided such a memory system that can reduce the level of a peak current for such an LSI chip as a dynamic memory in its wait operation mode and that can be suitably used for battery backup applications.

Figure 14A:
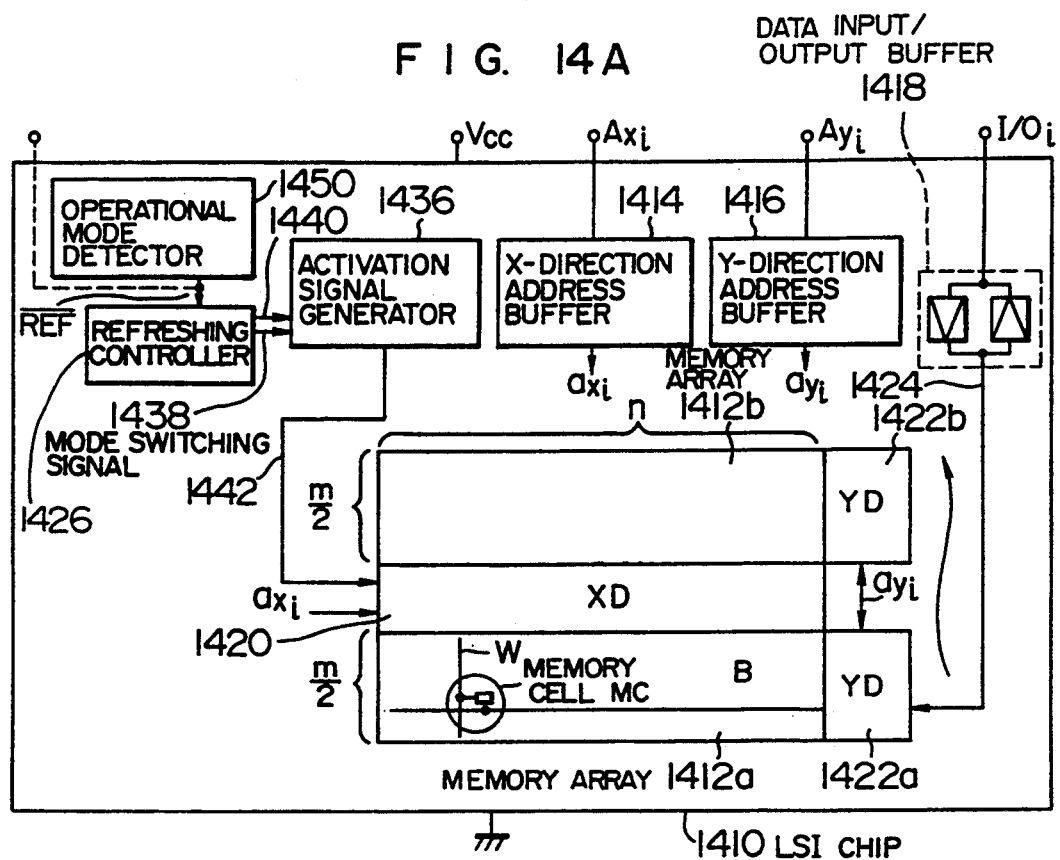
FIG. 14A is a block diagram for explaining the principle of a semiconductor system in accordance with another embodiment of the present invention.
Figure 14B:
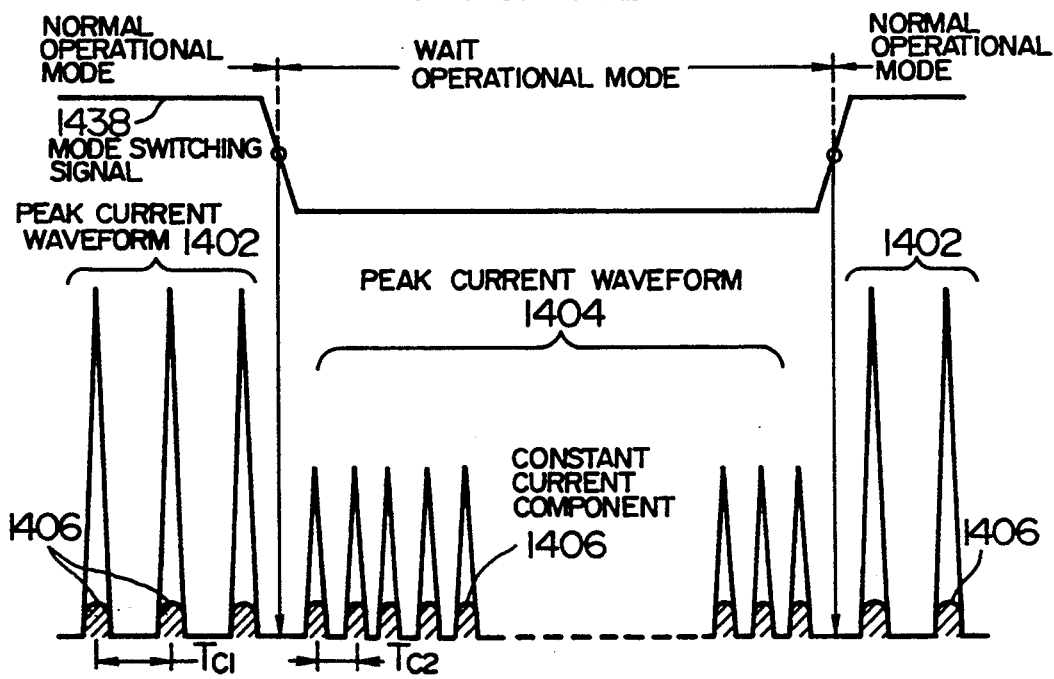
FIG. 14B shows a waveform of a peak current, together with a waveform of a mode switching signal, in normal and wait operation modes.

Another embodiment of the present invention is shown in FIG. 14, wherein FIG. 14A is a block diagram of a semiconductor memory system in accordance with the embodiment and FIG. 14B shows waveforms of a peak current in its normal and wait modes based on a refreshing operation. An LSI chip 1410 of FIG. 14A includes an X-direction address buffer 1414, a Y-direction address buffer 1416, a data input/output (I/O) buffer 1418, an X-direction decoder (XD) 1420, two memory arrays 1412a and 1412b divided by the X-direction decoder XD, Y-direction decoders (YD) 1422a and 1422b, a data input/output signal line 1424, and a power supply terminal $V_{cc}$. The LSI chip 1410 further includes a controller 1426 for controlling a refreshing timer, an address counter and associated refreshing devices, an operational mode detector 1450, a refreshing control signal $\overline{REF}$ as an output of the operational mode detector 1450, and a mode select signal 1438 which is generated at the refreshing controller 1426 on the basis of the control signal $\overline{REF}$ and according to the logic of a memory chip select signal and so on for switching between the wait and normal modes. In FIG. 14A, further, a word activation signal 1442 is used to switch to a different word line depending on the wait and normal operational modes, and an internal address signal 1440 is used to select either one of word lines of the X-direction decoder 1420. The LSI chip 1410 also includes a generator 1436 for generating the word activation signal 1442 in the wait mode, memory cells MC, n word lines W of the memory cells arranged in the X direction, a total m of bit lines B of the memory cells arranged in the Y direction at intervals of m/2 lines, a group of address signals $A_{xi}$ in the X direction, a group of internal signals $a_{xi}$ therefor, a group of address signals $A_{yi}$ in the Y direction, a group of internal signals $a_{yi}$ therefor and a group of input/output data $I/O_i$.

In FIG. 14B, on the other hand, reference numeral 1402 denotes a peak current flowing through the power supply terminal $V_{cc}$ in the normal operational mode, 1404 a peak current in the wait operational mode, and 1406 a constant current component always flowing through the memory interior circuit as an activation current in the wait and normal operational modes.

In a usual dynamic memory, the resistance of word lines is a big problem causing the delay of an access time. For the purpose of avoiding this problem, the memory array is divided into two by the X-direction decoder (XD) 1420 as illustrated in FIG. 14A. Further, in order to reduce the resistance of the word lines and to enhance the speed thereby, the word lines are divided into a plurality of groups. In accordance with the present invention, by positively making most use of the memory cell array necessarily determined by the division of the word lines, the reduction of the peak current can be achieved with a minor modification of the usual memory arrangement. Although explanation has been made as to the case where the operational mode detecting means 1450 is provided within the LSI chip in the present embodiment, such an $\overline{REF}$ input terminal as shown by a dotted line in FIG. 14A may be provided to enter as a signal a detection result detected by a detector for detecting a power off (drop or increase in the power voltage) of an external electronic apparatus.

The operation of the present embodiment of the invention will then be explained by referring to FIGS. 14A and 14B. In the refreshing operation based on the normal operational mode, the word lines at the both sides of the X-direction decoder (XD) 1420 are selected at the same time. As a result, the number of memory cells thus selected is m and the peak current $I_P$ is proportional to the number m (=number of bit lines) of the selected memory cells. The constant current component 1406, which is very small compared with the peak current $I_P$, can be expressed as a relationship of $I_P \propto m$. In the wait operational mode based on the battery, the operational-mode switching signal 1438 to be applied to the X-direction decoder (XD) 1420 causes the number of cells connected to the word lines to be reduced to m/2. Accordingly, the peak current $I_P$ in the wait operational mode is reduced to $I_P \propto m/2$.

A refreshing interval $T_{c2}$ in the wait operational mode is made shorter than a refreshing interval $T_{c1}$ in the normal operational mode and the frequency of the refreshing interval $T_{c2}$ is made twice of that of the refreshing interval $T_{c1}$ but this can be ignored in the inactivation mode as already explained above.

As has been described in the foregoing, in the present invention, the mode switching signal 1438 is generated on the basis of the refreshing control signal $\overline{REF}$ received externally or from the operational-mode detecting means 1450 and according to the signal 1438, the plurality of word lines are switched. As a result, in the wait mode, the number of cells selected through one refreshing operation can be decreased and the refreshing interval can be correspondingly made narrow, thus resulting in that the peak current can be suppressed to a very low level.

Figure 15A:
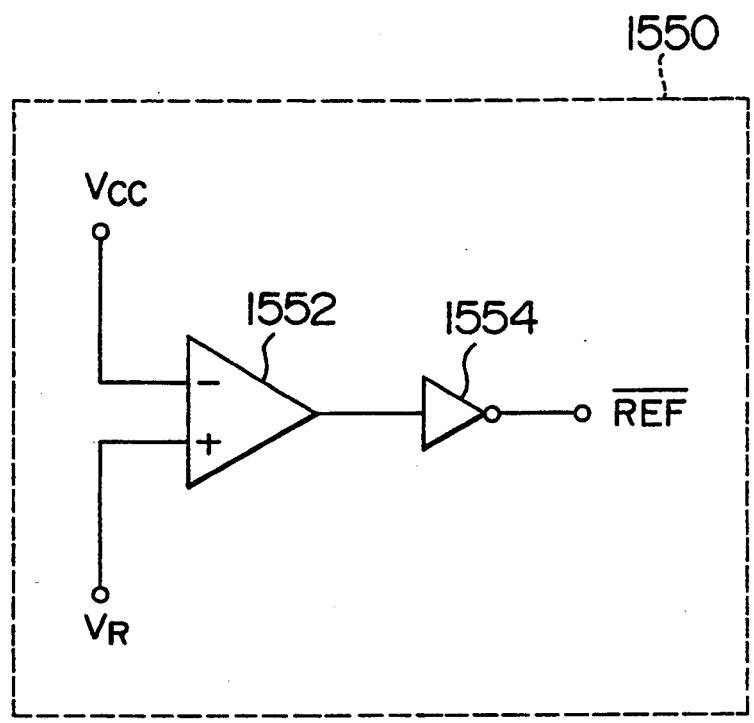
FIGS. 15A and 15B show a detailed example of an operational mode detecting means in FIG. 14A and a timing chart for explaining the operation thereof, respectively.

Shown in FIG. 15A is a detailed example of the operational-mode detector 1450 in FIG. 14. That is, an operational-mode detector 1550 of FIG. 15A acts to detect a shift from the normal operational mode to the wait mode allowing holding of data and to output its detection result as the refreshing control signal $\overline{REF}$ having a level "1" or "0". In FIG. 15A, reference symbol $V_{cc}$ denotes a power supply terminal and also a power voltage level on the terminal, $V_R$ denotes a reference voltage for judgement of drop or increase in the power supply voltage internally generated or externally applied, and $V_B$ the voltage of a backup battery. A discrimination circuit 1552 discriminates a high or low potential relation between the power supply voltage $V_{cc}$ and reference voltage $V_R$ as their inputs and outputs a low-level ("0") signal when $V_{cc}$ is higher than $V_R$ and outputs a high-level ("1") signal when $V_{cc}$ is lower than $V_R$. An inverter circuit 1554 functions to invert the output signal of the discriminator 1552. The arrangement of this operational-mode detecting means 1550 is known and in particular, the discriminator 1552 may comprise a Schmitt trigger circuit or a comparison circuit.

Figure 15B:
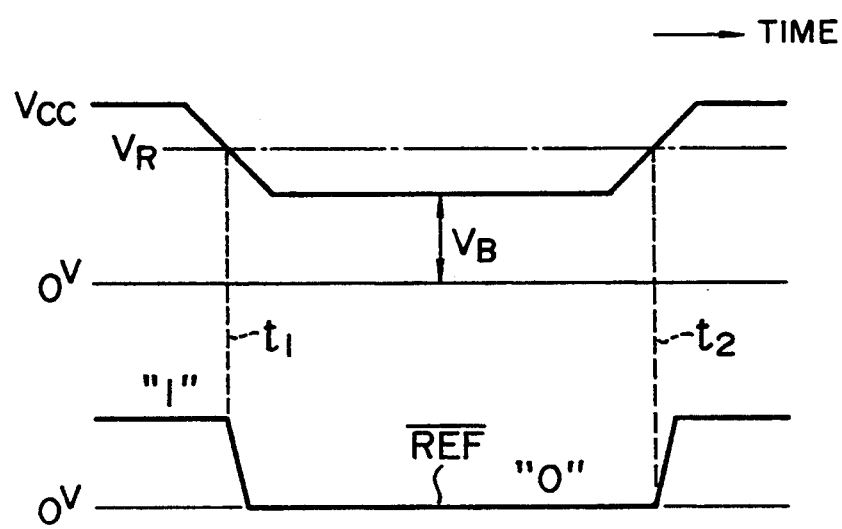

As shown in FIG. 15B, the refreshing control signal $\overline{REF}$ is reduced to low level and activated when the power supply voltage $V_{cc}$ drops to below the set reference voltage $V_R$ ($=t_1$), and the signal $\overline{REF}$ is increased to high level and inactivated when the voltage $V_{cc}$ raises to above the reference level $V_R$ ($=t_2$). Although one sort of level has been provided as the reference voltage $V_R$ in the present embodiment, a plurality of levels of reference voltages $V_R$ may be provided so that the refreshing control signal REF is easily activated and inactivated at the falling and rising times $t_1$ and $t_2$ according to the drop and rise of the $V_{cc}$ level. As such power-voltage-off (drop, rise) detecting circuit as mentioned above, many sorts of circuits have been proposed and one of such known circuits can be used as an operational mode detector to generate a switching signal in an operational mode, providing substantially the same effects.

Figure 16:
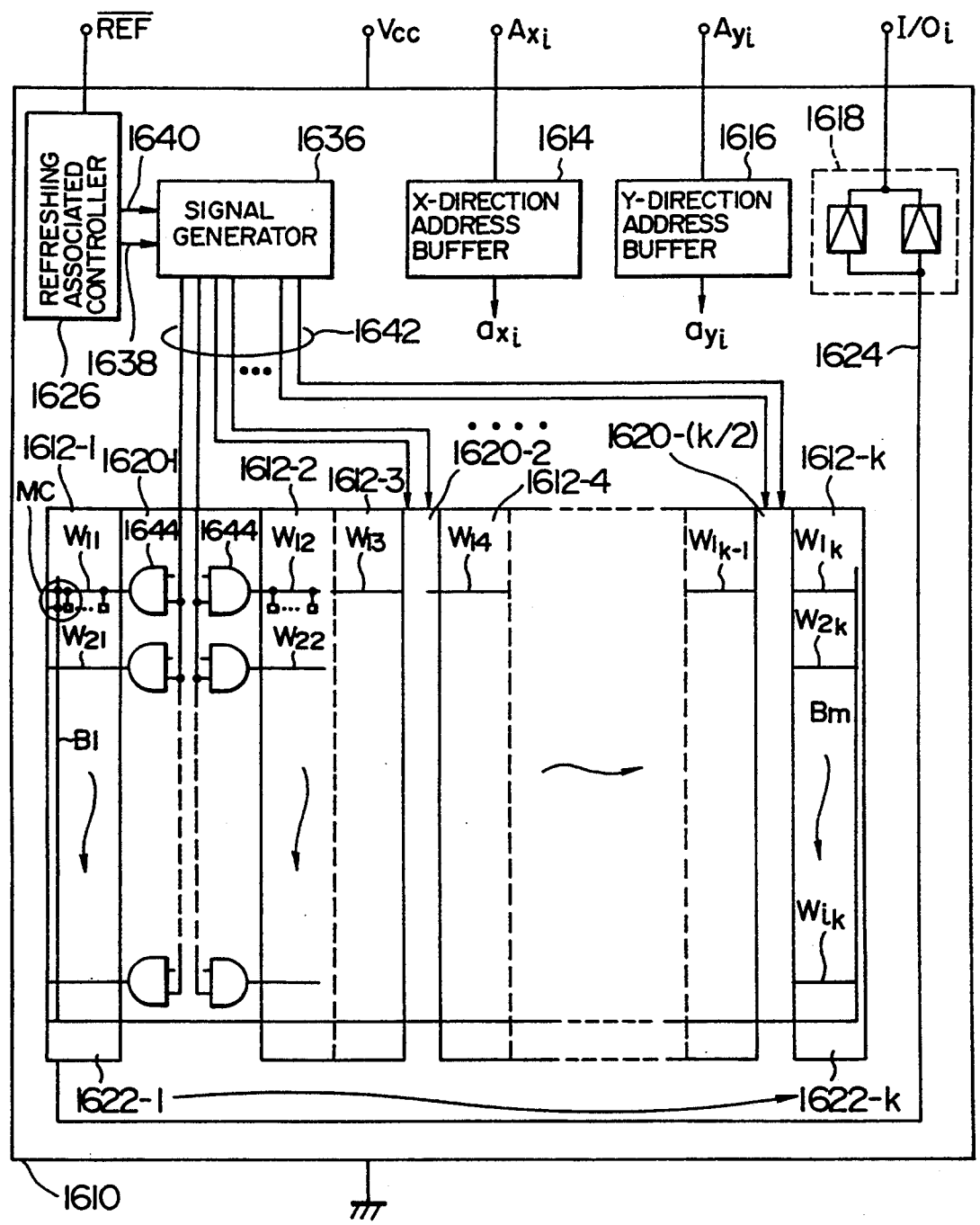
FIG. 16 is a block diagram of a detailed semiconductor memory system in accordance with a further embodiment of the present invention.

FIG. 16 is a block diagram of a semiconductor memory system showing another embodiment of the present invention. In the drawing, reference numeral 1610 denotes an LSI chip, 1612-1 to 1612-k an array of memories, 1614 an X-direction address buffer, 1616 a Y-direction address buffer, 1618 a data input/output (I/O) buffer, 1620-1 to 1620-(k/2) X-direction decoders (XDs), 1644 logic circuits for selection of word lines, 1622-1 to 1622-k Y-direction decoder (YDs), and 1624 a data input/output signal line. In the drawing, further, numeral 1626 represents a controller for controlling a refreshing timer, an address counter and devices associated therewith, 1638 a mode select signal for switching between wait and normal operation modes, 1642 word line activation lines for switching the word lines of the wait and normal operation modes, 1636 a generator for producing the word line activation signals, and 1640 an internal address signal for selecting one of word lines at both sides of the X-direction decoder in the wait mode. In addition, reference symbol MC denotes a memory cell, $W_{ll}$ to $W_{ik}$ (i x k) word lines of the memory cells arranged in the X direction, $B_1$ to $B_m$ m bit lines of the memory cells arranged in the Y direction, $A_{xi}$ a group of address signals for the X direction, $a_{xi}$ internal signals for the X-direction address signals to be applied to the X decoders (XDs) 1620, $A_{yi}$ a group of address signal for the Y direction, $a_{yi}$ internal signals for the Y-direction address signal to be applied to the Y decoders (YDs) 1622, $I/O_l$ a group of input/output data, and $\overline{REF}$ a refreshing control signal.

Explanation will be made as to the refreshing operation of the present invention. In FIG. 16, in the refreshing operation in the normal operation mode, the word line activation signals 1642 as outputs of the signal generator 1636, which are all at high level, are applied to the logic circuits 1644 so that the k of the word lines $W_{ll}$ to $W_{ik}$ in the Y direction are simultaneously selected through the logic circuits 1644 and are all set at high level, whereby a predetermined number of cells corresponding to m bits are refreshed. The next word lines $W_{2l}$ to $W_{2k}$ are refreshed in the same manner. In the wait operational mode, on the other hand, under the control of the internal address signal 1640 issued from the controller 1626, the word line activation signals 1642 cause the X-direction word lines $W_{ll}$ to $W_{ik}$, i.e., $W_{ll}, W_{12}, \ldots$ to be seperately activated. As a result, the number of cells (=number of bit lines) selected through one refreshing operation is reduced to m/k and the peak current in the refreshing operation is reduced to 1/k.

The shift to wait operational mode at the time of battery backup is carried out based on the refreshing control signal $\overline{REF}$ in the present embodiment, but the shift may be easily realized by detecting the off state of the power supply voltage within the chip and generating the operational-mode switching signal as shown in FIG. 15A, whereby a semiconductor memory system of good operability can be obtained. In the present embodiment, explanation has been made in connection with the case where the address signal necessary for the refreshing operation in the wait mode is generated within the memory chip. However, even if address signal is applied from outside of the LSI chip, the same effect of reducing the value of the peak current as the above case can be obtained. It also goes without saying that, with respect to the division of the word lines in the refreshing operation of the wait operational mode, the number of activated word lines has been set to be equal to the physically divided number of the chip layout in the present embodiment, but such activated word line number may be arbitrarily set. In the latter case, the value of the peak current corresponds to tenths of the activated word line number arbitrarily set.

Further, although explanation has been directed mainly to the memory circuit in the foregoing embodiment, the present invention can be applied to all sorts of LSIs including memory LSI and logic LSI, so long as the LSI can hold data at least partially therein and be used for the purpose of reducing the value of the peak current in the wait mode from the normal mode, as has been already explained above. In addition, the aforementioned relationships of "0" and "1", and high and low levels may be reversed as necessary, in which case the logical relationship of the circuit are all reversed.

Accordingly, the value of the peak current of the LSI chip in the wait operational mode of the dynamic memory can be made small and there can be provided a semiconductor memory system which is suitable for battery backup.

Prior to the description of another embodiment of the present invention with reference to FIG. 17, consideration will be directed to the embodiment of the memory card explained in connection with FIGS. 3 and 4.

When the connector 310 is not connected to such a data processor as a computer, power is supplied from the backup battery 311 through the power switching circuit 312 to the PSRAM 320 so that the self refreshing circuit 320a incorporated in the PSRAM 320 is operated and the PSRAM 320 performs its refreshing operation. This causes data to be held in the PSRAM 320, eliminating the need for any external refreshing operation. When the connector 310 is connected to the data processor, on the other hand, power is supplied from the data processor through the connector 310, power supply line 310a and power switching circuit 312 to the PSRAM 320. In this case, the refreshing request signal for the PSRAM 320 is generated at the access control circuit 319.

Since the refreshing operation can be carried out within the memory card independently of the external data processor in this manner, the data processor is required to perform only the similar control operation to the memory card having the SRAM and thus the present memory card can have a compatibility with the SRAM memory card.

When it is desired to store in the memory card the data of the data processor connected to the connector 310, the address signal is supplied from the data processor through the connector 310 and address signal line 310b to the address buffer 315 to specify the write address of the PSRAM 320. At the same time, the write enable signal $\overline{WE}$ is supplied from the data processor through the control signal line 310c to the access controller 319 and a data is supplied from the data processor through the data signal line 310d and data buffer 316 to the PSRAM 320 to write the supplied data in the specified address of the PSRAM 320.

When it is desired to read out a data from the PSRAM 320, similarly, the address signal through the address signal line 310b and the control signals such as the chip enable signal $\overline{CE}$ and output enable signal $\overline{OE}$ through the control line 310c are supplied to the PSRAM 320, so that a data is read out from the address of the PSRAM specified by the address signal and supplied therefrom through the data buffer 316, data signal line 310d and connector 310 to the data processor.

In the data reading operation, the access controller 319, when receiving the decoded output of the address signal from the decoder 314 and receiving the signal $\overline{CE}$ through the control signal line 310c, is operated to cause the data reading operation of the PSRAM 320 but to also control to avoid the overlapping between the data reading and refreshing operations because the refreshing request signal is also generated to cause the refreshing operation of the PSRAM 320.

The decoder 314 nay be provided between the access controller 319 and the PSRAM 320 so that the access controller 319 is operated in response to the signal $\overline{CE}$ and the decoder 314 is operated in response to the output of the access controller 319. Further, when only one PSRAM array is provided, the decoder 314 may be removed.

In FIG. 4 showing the detailed example of the access controller 319 in FIG. 3, the access controller 319 comprises the access arbitration circuit 419a and the chip enable signal conversion circuit 419b.

The access arbitration circuit 419a includes a first circuit in which the R-S flip-flop comprises the NAND gates 406a and 406b and an output of the NAND gate 406a is delayed through the delay 405a and then fed back to the NAND gate 406b, and a second circuit in which an output of the NAND gate 406b is delayed through the delay 405b and then fed back to the NAND gate 406a. In the access arbitration circuit 419a, the signal $\overline{CE}$ is inverted with respect to level and then applied to the NAND gate 406a, while the refreshing request signal $\overline{RFSH}$ is applied from the refreshing timer 419c to the NAND gate 406b. The output of the NAND gate 406a is the read access enable signal $\overline{Access}$ which enables the read access to the PSRAM 320, while the output of the NAND gate 406b is the refreshing enable signal $\overline{Refresh}$ which enables the refreshing operation of the PSRAM 320.

Figure 17:
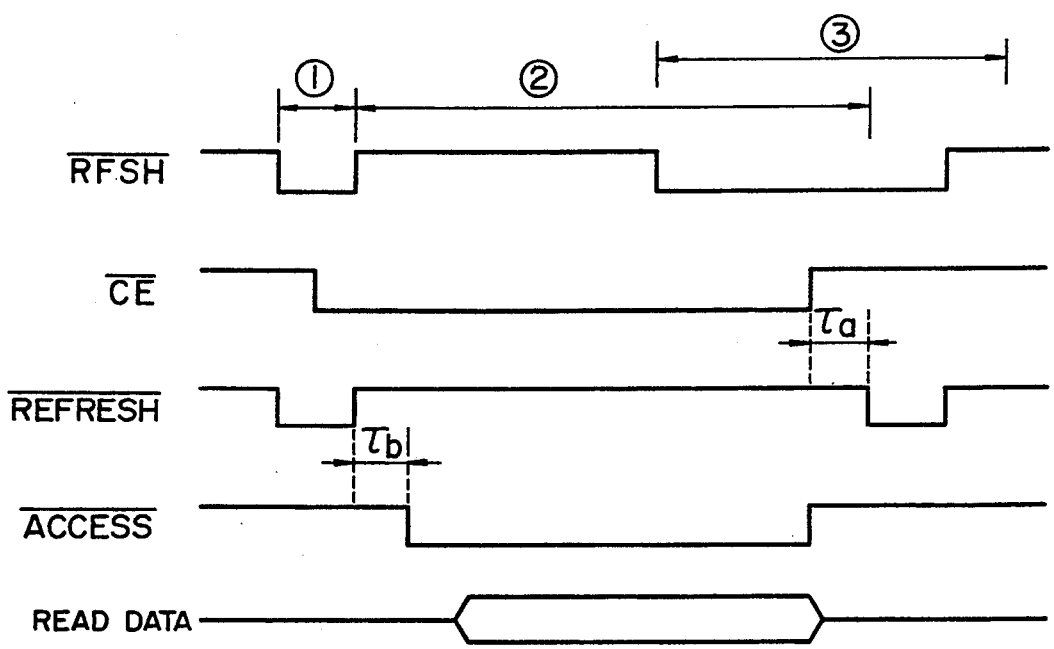
FIG. 17 is a timing chart for explaining the operation of an access mediating part in the system of FIG. 16.

With such an arrangement, when the refreshing request signal $\overline{RFSH}$ and the signal $\overline{CE}$ are supplied, the refreshing enable signal $\overline{Refresh}$ is generated at the same timing as the refreshing request signal $\overline{RFSH}$ in such a time duration as shown by ① in FIG. 17 but the read access enable signal $\overline{Access}$ is generated as delayed from the trailing edge of the refreshing request signal $\overline{RFSH}$ by a delay time $\tau_b$ of the delay circuit 405b. Thus, the PSRAM 320 performs its data reading operation after the delay time $\tau_b$ from the completion of the refreshing operation in such a time duration as shown by ② in FIG. 17.

When the refreshing request signal $\overline{RFSH}$ is generated during the active (generation) duration of the signal $\overline{CE}$, the refreshing enable signal $\overline{Refresh}$ is generated after a delay time $\tau_a$ of the delay circuit 405a from the completion of the signal $\overline{CE}$ and read access enable signal $\overline{Access}$, in such a time duration as shown by ③ in FIG. 17. Thus, the PSRAM 320 performs its refreshing operation after the delay time $\tau_a$ from the completion of the data reading operation.

The refreshing timer 419c is reset by an output signal of the delay circuit 405a so that, even when the refreshing request signal $\overline{RFSH}$ is generated at any timing, the time width of the refreshing enable signal $\overline{Refresh}$ can be made constant.

Figure 18:
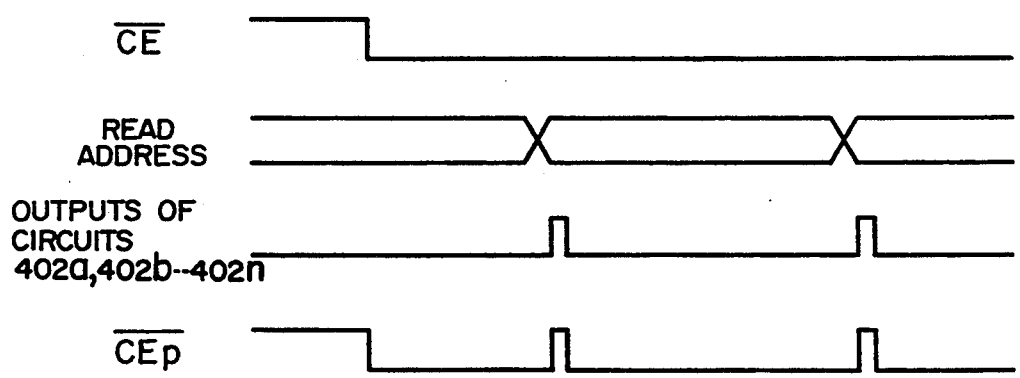
FIG. 18 is a timing chart for explaining the operation of a chip enable signal converting part in the system of FIG. 16.

In the chip enable signal conversion circuit 419b in FIG. 4, the EXOR circuits 402a, 402b, ..., and 402n detect a time point at the time of a change in the address signal and supply pulse signals indicative of the change time point and the signal $\overline{CE}$ to the OR circuit 403, whereby the signal $\overline{CE_P}$ corresponding to the signal $\overline{CE}$ indicative of the address change time points, as shown in FIG. 18. The signal $CE_P$ is applied to the AND gate 404 together with a gate signal corresponding to the inversion of the read access enable signal $\overline{Access}$ and then supplied to the chip enable terminal $\overline{CE}$ of the PSRAM 320.

Meanwhile, the PSRAM 320 reads out therefrom a data corresponding to the then specified address after a predetermined read access time from the rising edge of the signal $\overline{CE_P}$ and also operates the data buffer 316 at this timing to transfer the read-out data therefrom through the data buffer 316 to the data processor.

Figure 19:
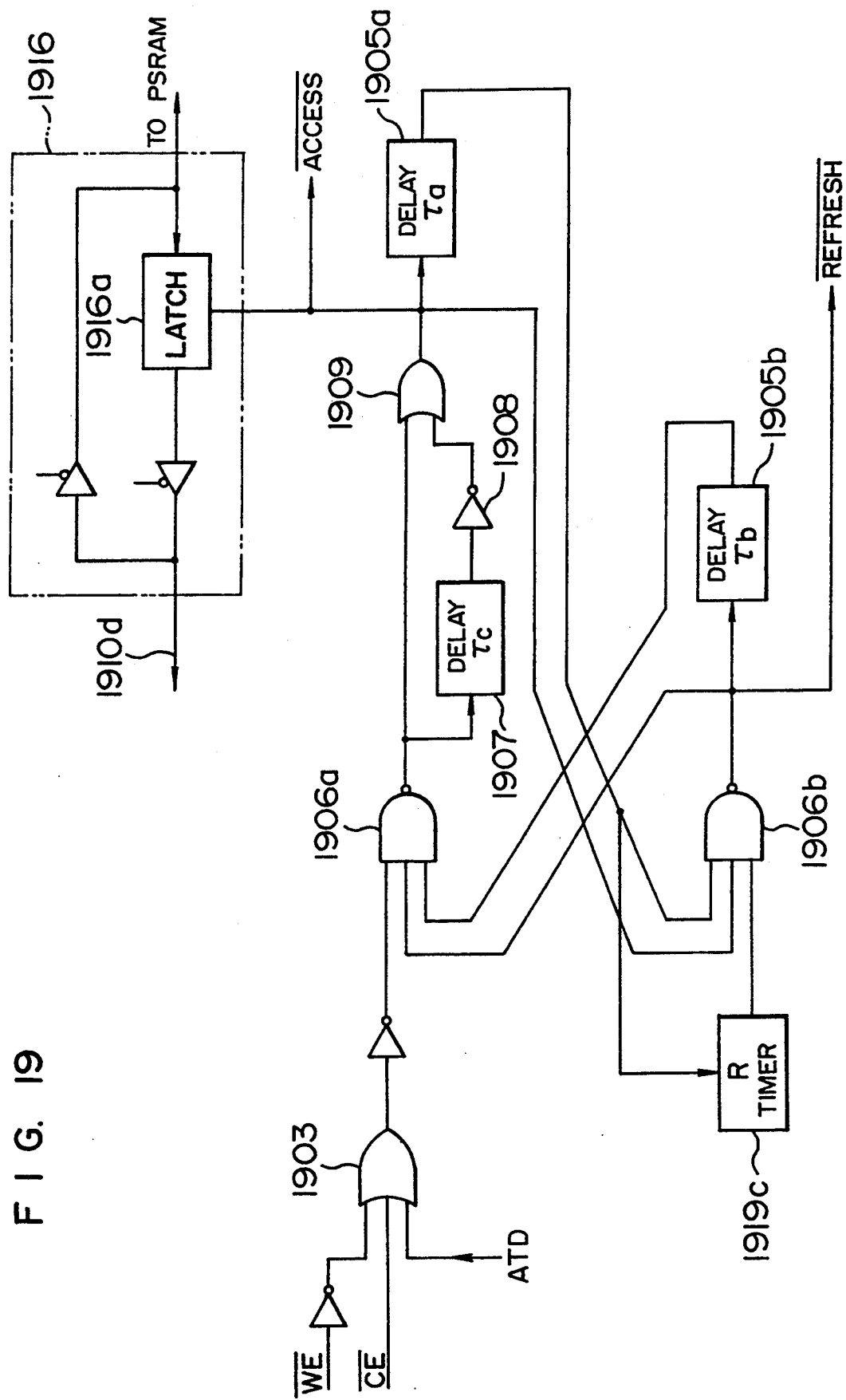
FIG. 19 is a block diagram showing an embodiment of a semiconductor memory control system in accordance with the present invention.

FIG. 19 is a block diagram of another embodiment of the semiconductor memory system in accordance with the present invention, which includes a delay circuit 1907, an inverter 1908, an OR circuit 1909 and a latch circuit 1916a.

In the drawing, the delay circuit 1907 for providing a delay to an output of the NAND gate 1906a, the inverter 1908 for inverting the output level of the delay circuit 1907, and the OR circuit 1909 for receiving outputs of the NAND gate 1906a and inverter 1908 are provided between an NAND gate 1906a and a delay circuit 1905a to latch the data read out from the PSRAM 320.

An OR circuit 1903 in FIG. 19 outputs a signal corresponding to the signal $\overline{CE}$ attached with pulses indicative of the change time points in the address signal, which output signal is applied to the R-S flip-flop. The refreshing enable signal $\overline{Refresh}$ is output from NAND gate 1906b, while the read access enable signal $\overline{Access}$ is output from the OR circuit 1909. This read access enable signal $\overline{Access}$ is generated from the OR circuit 1909 based on its logic sum operation. More in detail, an output of the NAND gate 1906a is applied to the OR circuit 1909 and is also delayed at the delay circuit 1907 and inverted at the inverter 1908 to obtain an inverted signal. The inverted signal from the inverter is applied also to the OR circuit 1909 to perform its logic sum operation of the output of the NAND gate 1906a and the inverted signal. The signal $\overline{Access}$ is an "L" level signal which has a time width equal to a delay time $\tau_c$ of the delay circuit 1907.

The operation of the present embodiment will next be explained, for the brevity of explanation, by referring to FIG. 20 in connection with the case where the output of the OR circuit 1903 is the signal $\overline{CE}$ itself, the signal $\overline{CE}$ is generated in the active (generation) duration of the refreshing request signal $\overline{RFSH}$, and the next refreshing request signal $\overline{RFSH}$ is generated in the generation duration of the signal $\overline{CE}$.

When the refreshing request signal $\overline{RFSH}$ is generated and the signal $\overline{CE}$ is supplied during the generation of the signal RFSH to instruct the read access mode, an output of the NAND gate 1906b as well as a signal corresponding to the same output delayed by the delay time $\tau_b$ caused through a delay circuit 1905b are applied to the NAND gate 1906a, so that the NAND gate 1906a is turned OFF not to output the signal $\overline{CE}$ therefrom. The output of the NAND gate 1906b corresponds to the refreshing enable signal $\overline{\text{Refresh}}$.

When the refreshing request signal $\overline{RFSH}$ is terminated and the delay time $\tau_b$ of the delay circuit 1905b elapses, the NAND gate 1906a outputs the signal $\overline{CE}$ and at this timing, the OR circuit 1909 outputs the read access enable signal $\overline{\text{Access}}$ having a time width equal to the delay time $\tau_c$ of the delay circuit 1907.

When this results in that the PSRAM is subjected by the refreshing enable signal $\overline{\text{REFRESH}}$ to a refreshing operation the PSRAM is subjected by the read access enable signal Access to a read accessing operation and a data reading operation therefrom after the delay time $\tau_c$ from the completion of the refreshing operation.

At this time, the data read out from the PSRAM is supplied to a data buffer 1916 and latched at the trailing edge (rising edge) of the read access enable signal $\overline{\text{Access}}$.

Next, when the next refreshing request signal $\overline{RFSH}$ is generated in the read access mode based on the signal $\overline{CE}$, since the output of the signal from the OR circuit 1909 is already completed, the refreshing request signal $\overline{RFSH}$ is output from the NAND gate 1906b as the refreshing enable signal $\overline{\text{Refresh}}$ to carry out the refreshing operation of the PSRAM.

Even when the signal $\overline{CE}$ from the external data processor causes the read access mode of the PSRAM to be specified and the read access mode lasts long to generate the refreshing request signal $\overline{RFSH}$ in this mode in this way, the read access mode of the PSRAM is prescribed actually by the read access enable signal $\overline{\text{Access}}$ having the time width $\tau_c$ issued from the OR circuit 1909, which results in that the PSRAM is subjected to a refreshing operation in response to this refreshing request. At this time, since the data read out from the PSRAM is latched at the latch circuit 1916a of the data buffer 1916, this will not cause any trouble in the data reading operation of the data processor.

It goes without saying that, when the refreshing request signal $\overline{RFSH}$ is generated during the output of the read access enable signal $\overline{\text{Access}}$ from the OR circuit 1909, the refreshing enable signal $\overline{\text{Refresh}}$ is generated after the delay time $\tau_a$ of the delay circuit 1905a from the completion of the read access enable signal $\overline{\text{Access}}$.

Figure 21:
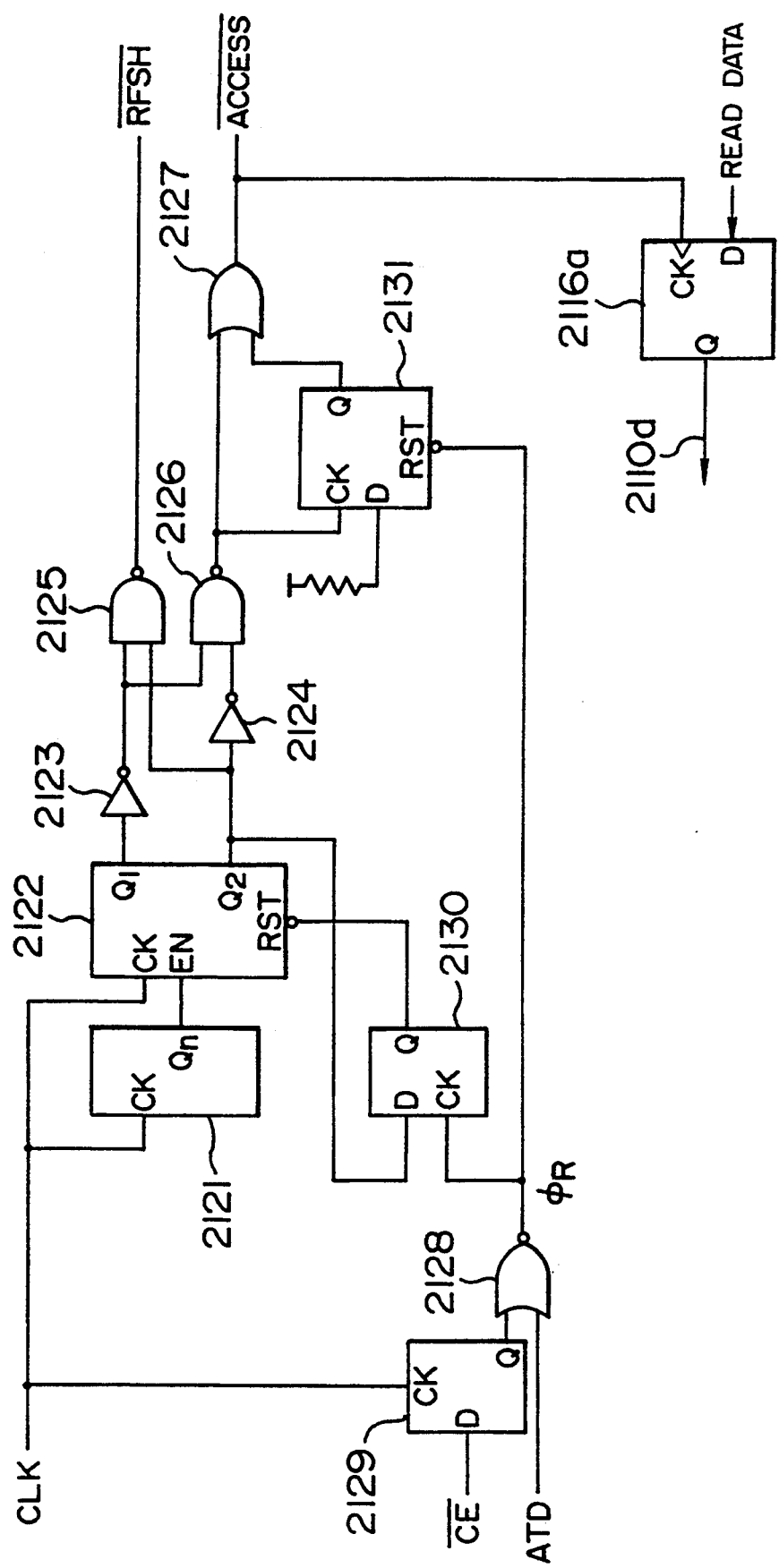
FIG. 21 is a block diagram showing another embodiment of the semiconductor memory control system in accordance with the present invention.

Shown in FIG. 21 is a block diagram of a semi-conductor memory control system in accordance with another embodiment of the present invention, which includes a frequency divider 2121, a flip-flop 2122, inverters 2123 and 2124, NAND gates 2125 and 2126, an OR circuit 2127, a NOR circuit 2128, and D flip-flops 2129, 2130 and 2131.

Figure 22A:
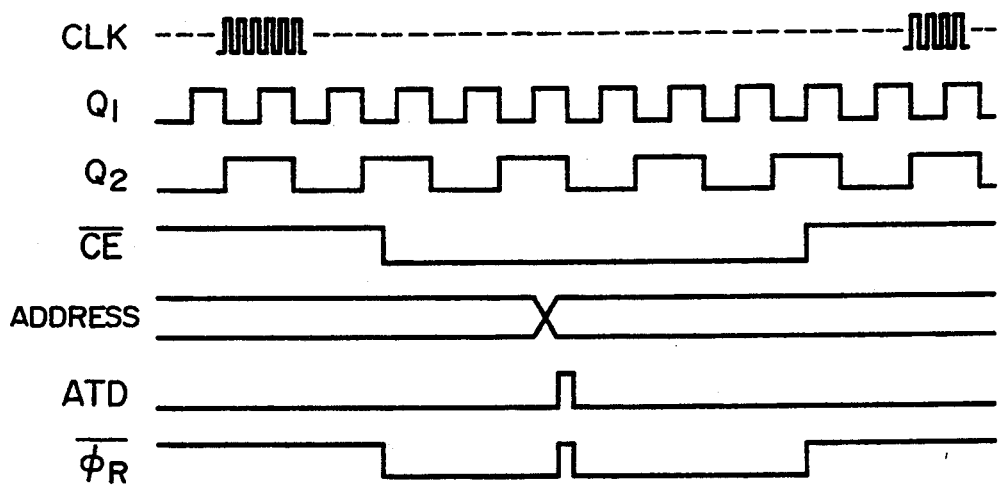
FIGS. 22A to 22C show timing charts for explaining the operation of the embodiment of FIG. 21.
Figure 22B:
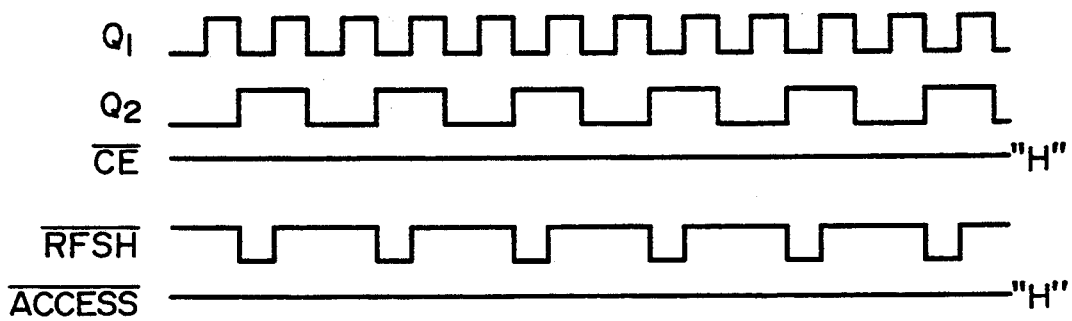
Figure 22C:
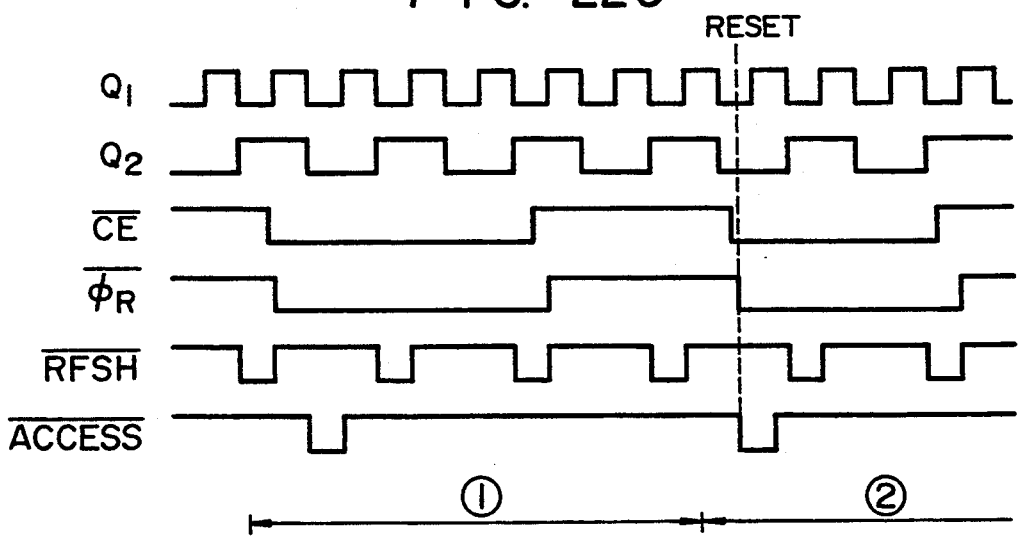

Explanation will then be made as to the operation of the present embodiment by referring to FIGS. 22A, 22B and 22C.

Referring first to FIG. 21 and 22A, the frequency divider 2121 outputs a pulse from its terminal $Q_n$ at intervals of n pulses in a clock signal CLK, while the flip-flop 2122 generates at its terminal $Q_1$ a $Q_1$ output whose level is inverted and a $Q_2$ output corresponding to ½ of the frequency of the $Q_1$ output each time receiving an output pulse from the frequency divider 2121. The frequency divider 2121 and the flip-flop 2122 make up a counter which counts the clock CLK.

The signal $\overline{CE}$ from the data processor (not shown) is shaped at the D flip-flop 2129 whose falling and rising edges are synchronized with the clock signal CLK, supplied to the NOR circuit 2128 and added thereat to a signal ATD indicative of a change time point in the address signal generated as in the chip enable signal conversion circuit 419b of FIG. 4 to thereby form a signal $\phi_R$ added with pulses corresponding to the change time points in the address signal.

In a standby mode shown in FIG. 22B, the signal $\overline{CE}$ supplied to the D flip-flop 2129 is at level "H" while the signal $\phi_R$ issued from the NOR circuit 2128 is kept at level "L".

The $Q_1$ output of the flip-flop 2122 is inverted with respect to level at the inverter 2123, whereas the $Q_2$ output of the flip-flop 2122 is supplied directly to the NAND gate 2125. Accordingly, the NAND gate 2125 outputs the refreshing request signal $\overline{RFSH}$ of level "L" only for the former half of the "H" duration of the $Q_2$ output of the flip-flop 2122, which signal $\overline{RFSH}$ is used as the refreshing enable signal (not shown) for the PSRAM. Thus, the PSRAM is refreshed in every "L" duration of the refreshing request signal $\overline{RFSH}$.

The $Q_1$ output level-inverted at the inverter 2123 and the $Q_2$ output level-inverted at the inverter 2124 are applied to the NAND gate 2126 which in turn outputs such a signal that has level "L" in the former half of the "L" duration of the $Q_2$ output, in which case the D flip-flop 2123 is in its reset released state. Therefore, in the D flip-flop 2131, its input D is sample-held at the initial falling edge of the output of the AND gate 2126 and its output Q is kept at level "H". And when the output of the NAND gate 2126 and the output Q of the D flip-flop 2131 held at level "H" are applied to the OR circuit 2127, the read access enable signal $\overline{\text{Access}}$ issued from the OR circuit 2127 is kept at level "H". As a result, the PSRAM is inhibited from being subjected to a read accessing operation.

In this manner, in the standby mode, the PSRAM is cyclically subjected to flip-flop operation at a constant period.

When it is desired to read out a data from the PSRAM, as shown in FIG. 22C, the signal $\overline{CE}$ is set at level "L" to instruct the read access mode from the data processor.

When attention is directed to an initial duration of the signal $\overline{CE}$ having level "L" in a duration shown by ① in FIG. 22c, the signal $\phi_R$ issued from the NOR circuit 2128 is synchronized with the clock CLK and corresponds to the level inversion of the signal $\overline{CE}$ in the absence of the signal ATD. For this reason, in the "H" duration of the signal $\phi_R$, i.e., in the "L" duration of the signal $\overline{CE}$, the D flip-flop 2131 is in its reset released state.

When the output of the NAND gate 2126 is initially at level "L", the D flip-flop 2131 still remains in its reset released state and has the Q output of level "L", so that the read access enable signal $\overline{\text{Access}}$ as the output of the OR circuit 2127 is at level "L", during which the PSRAM is subjected to a data reading operation therefrom. A data read out from the PSRAM is supplied to the latch circuit 2116a and latched therein at the rising edge (trailing edge) of the read access enable signal Access.

Meanwhile, the D flip-flop 2131 samples and holds the D input of its terminal D having level "H" at the initial rising edge of the output of the NAND gate 2126 after its reset release to provide level "H" to the Q output at its output terminal Q. This continues until the output signal $\phi_R$ of the NOR circuit 2128 is changed to level "L", that is, until the signal $\overline{CE}$ is changed to level "H" and the D flip-flop 2131 is reset.

Under such a condition, when there is no change in the address signal and data reading is carried out from the specified address of the PSRAM during the duration of the read access mode specified by the signal $\overline{CE}$, the D flip-flop 2131 masks the "L" duration in the output of the NAND gate, 2126 to inhibit the output of the OR circuit 2127 and thereby prevent thereafter the read re-access during the specified read access mode duration.

Assume next that the read access mode is again specified by the signal $\overline{CE}$ during the "L" duration of the $Q_2$ output of the flip-flop 2122 in such a duration as denoted by ② in FIG. 22C.

In this case, the D flip-flop 2130 samples and holds the $Q_2$ output of level "L" at the rising edge of the signal $\phi_R$ from the NOR circuit 2128 and provides level "L" to its q output, whereby the flip-flop 2122 is reset at the falling edge of the Q output, from which timing the counter comprising the frequency divider 2121 and the flip-flop 2122 restarts the counting operation of the clock signal CLK. Thus, from the reset timing of the flip-flop 2122, the $Q_1$ output of the flip-flop 2122 is at level "L" for a time duration corresponding to ½ of the period of the $Q_1$ output and the $Q_2$ output thereof is also at level "L" for a time duration corresponding to ¼ of the period of the $Q_2$. During the duration of the "L" level of the both $Q_1$ and $Q_2$ outputs (which duration starts from the rising edge of the signal $\phi_R$), the output of the NAND gate 2126 becomes level "L" and the reset state of the D flip-flop 2131 is released at the rising edge of the signal $\phi_R$. As a result, the signal $\phi_R$ has level "H" and the read access enable signal Access from the OR circuit 2127 has level "L", whereby the reading operation of the PSRAM is carried out. Thereafter, the same operation as explained in connection with the duration 1 in FIG. 22C is carried out.

In this manner, through the masking function of the D flip-flop 2131, only one data reading operation is ensured for the specified address and the refreshing operation of the PSRAM is carried out without any break during the period where no read access is effected.

In the present embodiment, since the data read out through the read access operation is latched at the latch circuit 2116a at the end of the reading operation, the refreshing operation of the PSRAM can be realized without any troubles and it can be avoided that the input of the read data to the data processor is influenced by the refreshing operation of the PSRAM.

Further, since the read data is latched to put the PSRAM in its standby mode, power saving can be realized. In addition, according to the present embodiment, the refreshing operation of the PSRAM can be periodically realized regardless of the time duration length of the external read access mode to ensure the data holding of the PSRAM, the data can be prevented from being destroyed by the refreshing operation, and the output of the read data to the external device can be achieved without any troubles.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A semiconductor memory comprising:
a dynamic RAM having a refresh operation performed in response to receipt of a refresh signal;
refreshing means, coupled to said dynamic RAM, for generating said refresh signal for refreshing said dynamic RAM;
signal reception means for receiving an access signal from an external device;
access control means for controlling access to said dynamic RAM on the basis of said refresh signal received from said refreshing means and said access signal received from said signal reception means;
said access control means including arbitration means for setting a constant time period for read accessing, shifted a predetermined time from a refresh period corresponding to said refresh signal, when a read access signal from said external device is received during a refreshing time period in said dynamic RAM; and
connector means for providing said access signal from an external device to said signal reception means when the semiconductor memory is coupled to said external device.

2. The semiconductor memory as set forth in claim 1, further comprising mode switching means for supplying indication of switching between two or more operational modes having different peak values of current supplied to said dynamic RAM.

3. The semiconductor memory as set forth in claim 2, wherein said operational modes of the semiconductor memory include a wait operational mode and a normal operational mode, the number of cells selected for one refresh operation in said wait operational mode is set to be smaller than that in said normal operational mode.

4. The semiconductor memory as set forth in claim 2, wherein said operational modes of the semiconductor memory include a wait operational mode and a normal operational mode, and a refreshing interval in said wait operational mode is set to be shorter than a refreshing interval in said normal operation mode.

5. The semiconductor memory as set forth in claim 2, wherein said operational modes of the semiconductor memory include a wait operational mode and a normal operation mode, and a word line activation signal is provided for activating some of a plurality of divided word lines, and wherein a number of the plurality of divided word lines activated in said wait operational mode being less in number than that activated in said normal wait operational mode.

6. The semiconductor memory as set forth in claim 1, further comprising:
battery means for supplying power to said dynamic RAM; and
a power supply switching circuit, coupled to said battery means and said connector means, for supplying power to said dynamic RAM from said external device instead of from said battery means when the memory semiconductor is coupled to said external device through said connector means.

7. The semiconductor memory as set forth in claim 6, wherein:
said dynamic RAM includes a plurality of dynamic RAM chips, each dynamic RAM chip having
resistance means which is connected to a power supply of said external device and said battery means when the semiconductor memory is coupled to said external device, and which is also connected to a power input terminal of said dynamic RAM in series with said dynamic RAM; and
capacitance means connected to the ground and between a power input terminal of said dynamic RAM and said resistance means; and
said resistance means and said capacitance means smoothing a peak current in a refresh period supplied to said dynamic RAM.

8. The semiconductor memory as set forth in claim 1, further comprising change detection means for detecting a change in an address signal supplied from said external device when the semiconductor is connected to said external device.

9. The semiconductor memory as set forth in claim 1, wherein said access control means includes change detection means for detecting a change in an address signal supplied from said external device when the semiconductor memory is connected to said external device,
said access control means generating a DRAM access signal corresponding to logic level inversion of a memory access signal supplied from said external device to said dynamic RAM for a predetermined time duration on the basis of detection of change in said address signal.

10. The semiconductor memory as set forth in claim 9, wherein said access control means inverts a logic level of a memory chip select signal and a chip enable signal supplied from the semiconductor memory.

11. The semiconductor memory as set forth in claim 1, wherein said access control means comprises:
counter means for counting a clock signal supplied from said external device or from a clock generator of the semiconductor memory;
logic operation means for performing a logic operation on said access signal and an output signal of said counter means, wherein bits of said counter means are allocated to both of a duration allowing generation of an access enable signal and a duration allowing generation of refreshing enable signal; and means for generating,
in response to receipt of a refreshing enable signal, the refreshing enable signal when values of said bits are allocated to said duration of allowing generation of a said refreshing enable signal, and,
in response to receipt of memory access signals, said access signals when the values of said bits are allocated to said duration allowing generation of said access enable signal.

12. The semiconductor memory as set forth in claim 1, wherein said arbitration means comprises:
counter means for counting a clock signal supplied from said external device or from a clock generator of said semiconductor memory;
wherein at least two digit bits of said counter means are allocated to a duration allowing generation of an access enable signal, a precharge duration for said access enable signal, a duration for generation of a refreshing enable signal, and a precharge duration for said refreshing enable signal; and
means for generating the refreshing enable signal and receiving memory access signals including a chip select signal and a chip enable signal when values of said two digit bits are allocated to said duration of generating the refreshing enable signal and for generating said access enable signal when values of said two digit bits are allocated to said duration of generating said access enable signal.

13. The method of controlling a semiconductor memory which requires a refreshing operation to store and hold data therein, wherein read access to the semiconductor memory is externally specified, comprising the steps of:
setting a read access duration having a predetermined time width which is shifted by a predetermined time from refreshing duration when said read access to said semiconductor memory is specified during a refreshing operation; and
latching a held data read out from the semiconductor memory in a latching circuit at the end of said set read access duration.

14. The method of controlling a semiconductor memory as set forth in claim 13, further comprising the step of setting a next refreshing duration following said set read access duration as delayed by a predetermined time from said set read access duration.

15. The memory semiconductor as set forth in claim 1, wherein said arbitration means enables one of said refresh signal and said access signal which has been provided earlier than the other and disables the other.

* * * * *